US012751009B2

(12) United States Patent
Choi et al.

(10) Patent No.: US 12,751,009 B2
(45) Date of Patent: Sep. 29, 2026

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Moorym Choi, Suwon-si (KR); Jungtae Sung, Suwon-si (KR); Yunsun Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 706 days.

(21) Appl. No.: 18/076,090

(22) Filed: Dec. 6, 2022

(65) Prior Publication Data

US 2023/0320096 A1 Oct. 5, 2023

(30) Foreign Application Priority Data

Apr. 4, 2022 (KR) ........................ 10-2022-0041652

(51) Int. Cl.
*H10B 43/27* (2023.01)
*H10B 43/40* (2023.01)

(52) U.S. Cl.
CPC ............. *H10B 43/27* (2023.02); *H10B 43/40* (2023.02)

(58) Field of Classification Search
CPC ................................ H10B 43/27; H10B 43/40
See application file for complete search history.

(56) References Cited

U.S. PATENT DOCUMENTS 8,971,118 B2 3/2015 Jin et al.
9,627,405 B1 4/2017 Lee
(Continued)

FOREIGN PATENT DOCUMENTS

KR 10-2017-0112292 A 10/2017
KR 10-2019-0143691 A 12/2019
(Continued)

OTHER PUBLICATIONS

Office Action dated May 27, 2026, issued by Korean Ministry of Intellectual Property in Korean Patent Application No. 10-2022-0041652.

*Primary Examiner* — Eliseo Ramos Feliciano
*Assistant Examiner* — Timothy Edward Duren
(74) *Attorney, Agent, or Firm* — Sughrue Mion, PLLC

(57) ABSTRACT

A three-dimensional semiconductor memory device includes a substrate, a peripheral circuit structure provided on the substrate, and a cell array structure provided on the peripheral circuit structure. The cell array structure includes a stack including alternating interlayer insulating layers and conductive patterns, the conductive patterns including gate electrodes and a first source conductive pattern that is an uppermost pattern of the conductive patterns, a second source conductive pattern provided on the stack and in contact with a top surface of the first source conductive pattern, the second source conductive pattern including a material different from a material of the first source conductive pattern, and vertical channel structures provided to penetrate the stack and to be inserted into a lower portion of the second source conductive pattern. The vertical channel structures include vertical semiconductor patterns connected to the second source conductive pattern.

13 Claims, 20 Drawing Sheets

(56) References Cited

U.S. PATENT DOCUMENTS

| | | | | |
|---|---|---|---|---|
| 10,629,616 | B1 | 4/2020 | Kai et al. | |
| 10,964,714 | B2 | 3/2021 | Lim et al. | |
| 11,107,802 | B2 | 8/2021 | Nakaki | |
| 11,195,781 | B2 | 12/2021 | Okina et al. | |
| 11,195,849 | B2 | 12/2021 | Yoshimizu et al. | |
| 11,637,190 | B2 | 4/2023 | Lee | |
| 2015/0079743 | A1 * | 3/2015 | Pachamuthu | H10B 41/20 438/268 |
| 2021/0036002 | A1 | 2/2021 | Lee | |
| 2021/0043647 | A1 * | 2/2021 | Kim | H10B 43/27 |
| 2021/0066282 | A1 * | 3/2021 | Kim | H10D 84/038 |
| 2021/0066343 | A1 * | 3/2021 | Choi | H10B 41/10 |
| 2021/0082941 | A1 * | 3/2021 | Son | H01L 23/528 |
| 2021/0082950 | A1 | 3/2021 | Yoshimizu | |
| 2021/0202458 | A1 * | 7/2021 | Jung | H01L 25/18 |
| 2021/0217769 | A1 | 7/2021 | Lee | |

FOREIGN PATENT DOCUMENTS

| | | | | |
|---|---|---|---|---|
| KR | 10-2021-0015445 | A | | 2/2021 |
| KR | 10-2021-0018725 | A | | 2/2021 |
| KR | 20210025032 | A | * | 3/2021 |
| KR | 10-2021-0083429 | A | | 7/2021 |
| KR | 10-2021-0092090 | A | | 7/2021 |
| KR | 10-2021-0134523 | A | | 11/2021 |
| KR | 10-2022-0016716 | A | | 2/2022 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATIONS

This application is based on and claims priority under 35 U.S.C. § 119 to Korean Patent Application No. 10-2022-0041652, filed on Apr. 4, 2022, in the Korean Intellectual Property Office, the disclosure of which is incorporated by reference herein in its entirety.

BACKGROUND

1. Field

Example embodiments of the present disclosure relate to a three-dimensional semiconductor memory device, a method of fabricating the same, and an electronic system including the same, and in particular, a three-dimensional semiconductor memory device including a peripheral circuit structure and a cell array structure, a method of fabricating the same, and an electronic system including the same.

2. Description of Related Art

A semiconductor device capable of storing a large amount of data is required as a data storage of an electronic system. Higher integration of semiconductor devices is required to satisfy consumer demands for large data storing capacity, superior performance, and inexpensive prices. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Provided are a three-dimensional semiconductor memory device with improved electrical and reliability characteristics and a method of fabricating the same.

Also provided are a three-dimensional semiconductor memory device and a simplified method of fabricating the same.

Additional aspects will be set forth in part in the description which follows and, in part, will be apparent from the description, or may be learned by practice of the presented embodiments.

According to an aspect of an example embodiment, a three-dimensional semiconductor memory device may include a substrate, a peripheral circuit structure provided on the substrate, and a cell array structure provided on the peripheral circuit structure. The cell array structure may include a stack including alternating interlayer insulating layers and conductive patterns, the conductive patterns including gate electrodes and a first source conductive pattern that is an uppermost pattern of the conductive patterns, a second source conductive pattern provided on the stack and in contact with a top surface of the first source conductive pattern, the second source conductive pattern including a material different from a material of the first source conductive pattern, and vertical channel structures provided to penetrate the stack and to be inserted into a lower portion of the second source conductive pattern. The vertical channel structures may include vertical semiconductor patterns connected to the second source conductive pattern.

According to an aspect of an example embodiment, a three-dimensional semiconductor memory device may include a substrate, a peripheral circuit structure provided on the substrate, and a cell array structure provided on the peripheral circuit structure. The cell array structure may include a cell array region, a cell array contact region, a stack including alternating interlayer insulating layers and conductive patterns, the conductive patterns including gate electrodes and a first source conductive pattern that is an uppermost pattern of the conductive patterns, a second source conductive pattern provided on the stack and in contact with a top surface of the first source conductive pattern, the second source conductive pattern including a material different from a material of the first source conductive pattern, vertical channel structures provided to penetrate the stack and to be inserted into a lower portion of the second source conductive pattern, cell contact plugs provided in the cell array contact region and respectively connected to the gate electrodes, a source contact plug provided in the cell array contact region and connected to a bottom surface of the first source conductive pattern, and bit lines connected to the cell contact plugs. The vertical channel structures may include vertical semiconductor patterns connected to the second source conductive pattern.

According to an aspect of an example embodiment, an electronic system may include a three-dimensional semiconductor memory device including a substrate, a peripheral circuit structure provided on the substrate, and a cell array structure provided on the peripheral circuit structure, the cell array structure including a cell array region and a cell array contact region, and a controller configured to control the three-dimensional semiconductor memory device. The cell array structure may include a stack including alternating interlayer insulating layers and conductive patterns, the conductive patterns including gate electrodes and a first source conductive pattern that is an uppermost pattern of the conductive patterns, a second source conductive pattern provided on the stack and in contact with a top surface of the first source conductive pattern, the second source conductive pattern including a material different from a material of the first source conductive pattern, and vertical channel structures provided to penetrate the stack and to be inserted into a lower portion of the second source conductive pattern. The vertical channel structures may include vertical semiconductor patterns connected to the second source conductive pattern.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Example embodiments of the disclosures will now be described more fully with reference to the accompanying drawings, in which example embodiments are shown.

Figure 1:
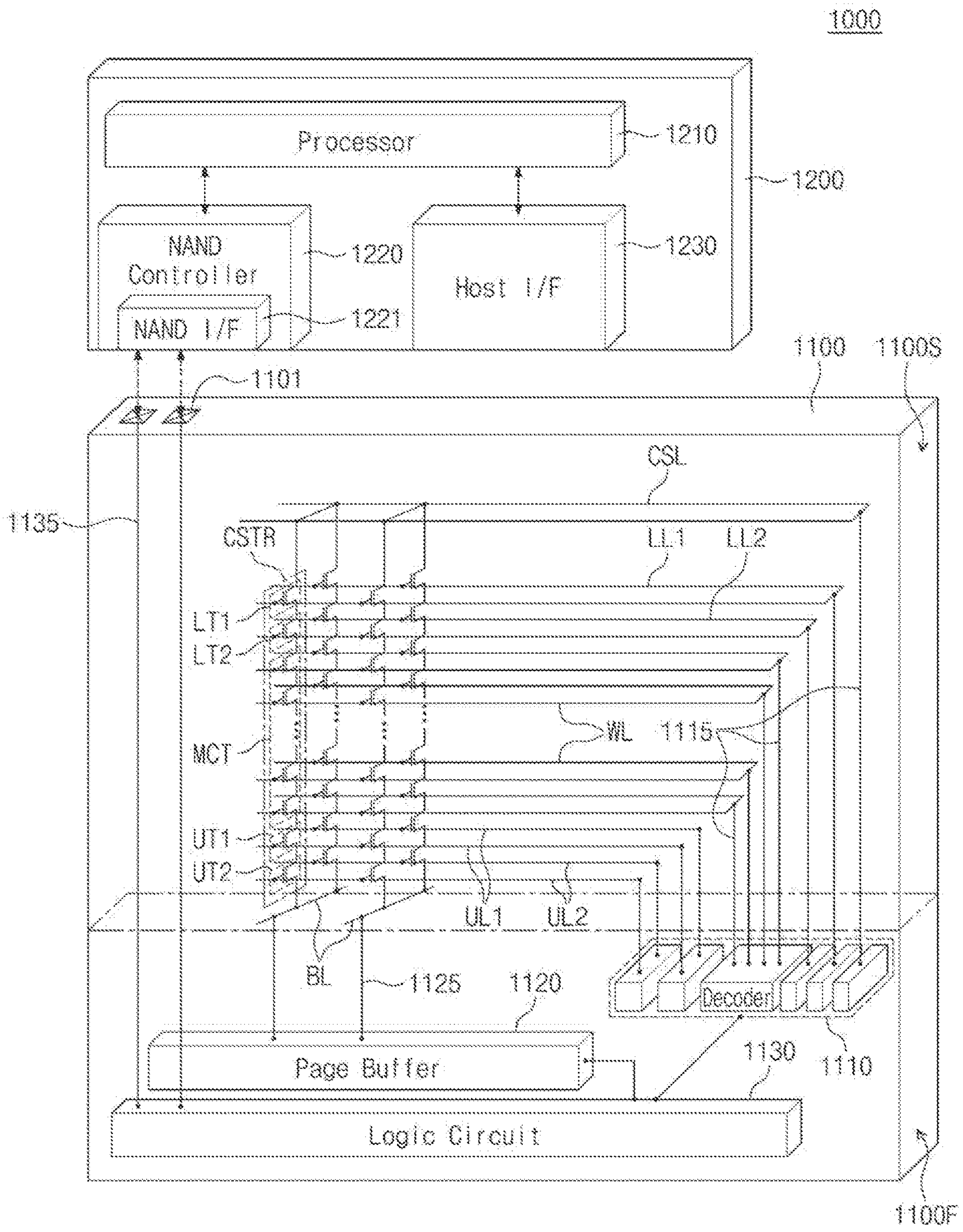
FIG. 1 is a diagram illustrating an electronic system including a three-dimensional semiconductor memory device according to an example embodiment.

FIG. 1 is a diagram illustrating an electronic system including a three-dimensional semiconductor memory device according to an example embodiment.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. However, unlike that illustrated in the drawings, the first region 1100F may be disposed beside the second region 1100S. The first region 11001F may be a peripheral circuit region, which includes a decoder circuit 1110, a page buffer 1120, and a logic circuit 1130. The second region 1100S may be a memory cell region, which includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may serve as gate electrodes of the first transistors LT1 and LT2. The word lines WL may serve as gate electrodes of the memory cell transistors MCT, and the second lines UL1 and UL2 may serve as gate electrodes of the second transistors UT1 and UT2.

For example, the first transistors LT1 and LT2 may include a first erase control transistor LT1 and a ground selection transistor LT2, which are connected in series. For example, the second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit lines BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor that is selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. In an embodiment, the electronic system 1000 may include a plurality of three-dimensional semiconductor memory devices 1100, which are controlled by the controller 1200.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands to control the three-dimensional semiconductor memory device 1100, data to be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100 in response to the control command.

Figure 2:
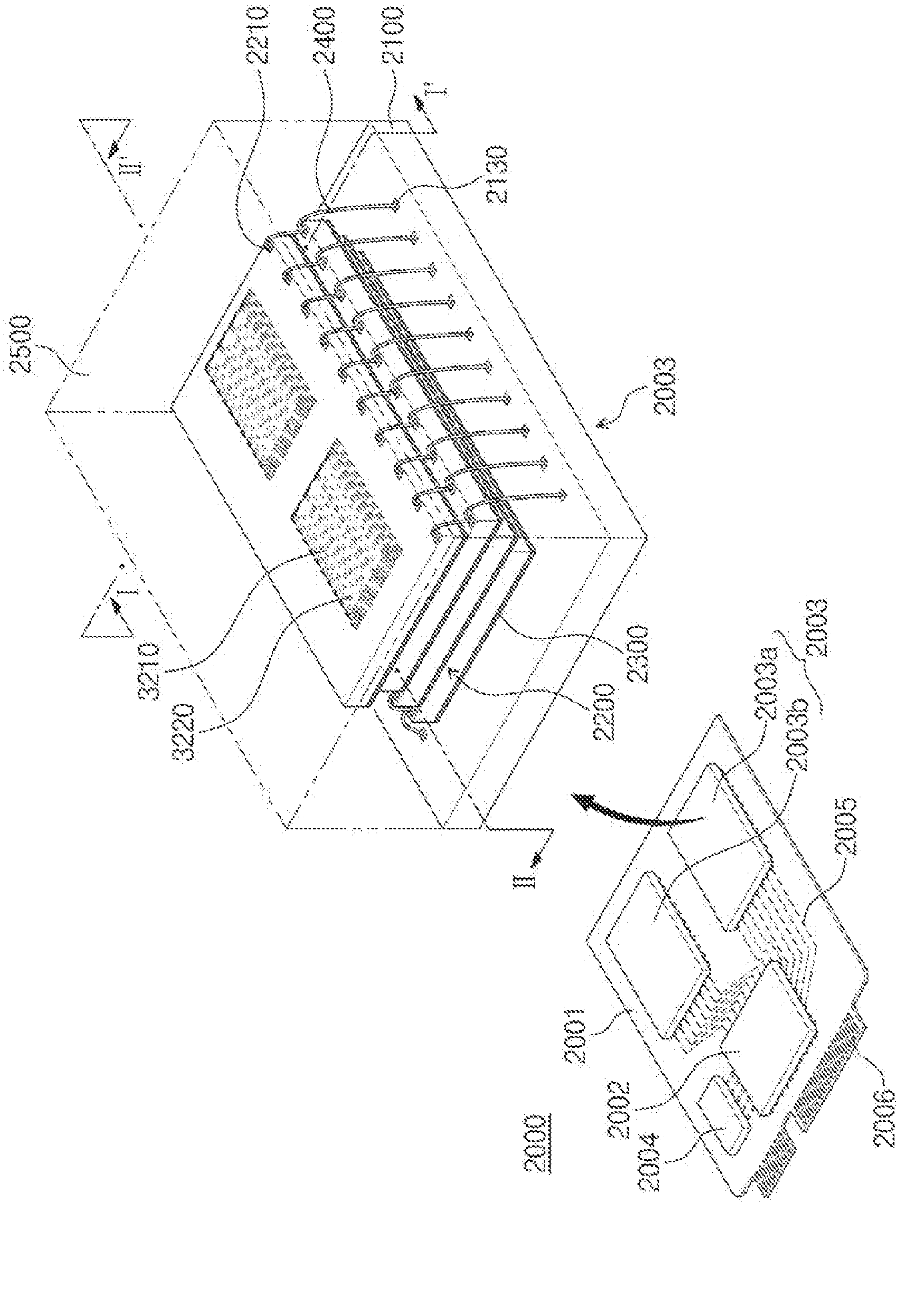
FIG. 2 is a perspective view illustrating an electronic system including a three-dimensional semiconductor memory device according to an example embodiment.

FIG. 2 is a diagram illustrating an electronic system including a three-dimensional semiconductor memory device according to an example embodiment.

Referring to FIG. 2, an electronic system 2000 may include a main substrate 2001 and a controller 2002, one or more semiconductor packages 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and an external host. For example, the electronic system 2000 may communicate with the external host, in accordance with one of interfaces, such as USB, peripheral component interconnect express (PCI-Express), serial advanced technology attachment (SATA), universal flash storage (UFS) M-PHY, or the like. In an embodiment, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may control a writing or reading operation on the semiconductor package 2003 and may improve an operation speed of the electronic system 2000.

The DRAM 2004 may be a buffer memory that is used to relieve technical difficulties caused by a difference in speed between the semiconductor package 2003, which serves as a data storage device, and an external host. In an embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200, which are provided on the package substrate 2100, adhesive layers 2300, which are respectively disposed in bottom surfaces of the semiconductor chips 2200, connection structures 2400, which are used to electrically connect the semiconductor chips 2200 to the package substrate 2100, and a molding layer 2500, which is provided on the package substrate 2100 to cover the semiconductor chips 2200 and the connection structures 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and memory channel structures 3220. Each of the semiconductor chips 2200 may include a three-dimensional semiconductor memory device, which will be described below.

The connection structures 2400 may be, for example, bonding wires, which are used to electrically connect the input/output pads 2210 to the package upper pads 2130. That is, in each of the first and second semiconductor packages 2003*a* and 2003*b*, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003*a* and 2003*b* may be electrically connected to each other by through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, not on the main substrate 2001, and may be connected to each other through interconnection lines, which are provided in the interposer substrate.

Figure 3:
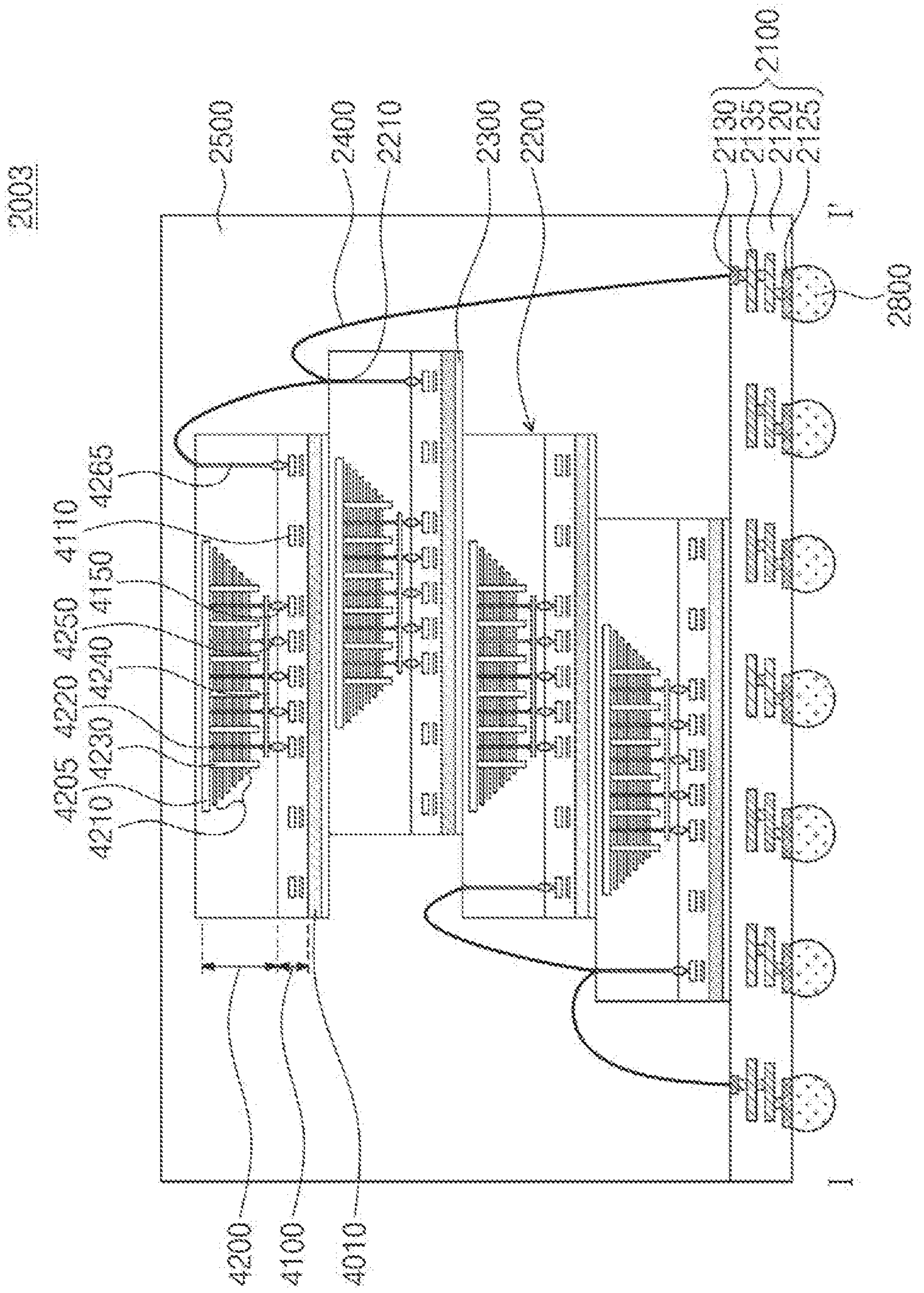
FIGS. 3 and 4 are sectional views, which are respectively taken along lines I-I' and II-II' of FIG. 2, illustrating a semiconductor package including a three-dimensional semiconductor memory device according to an example embodiment.
Figure 4:
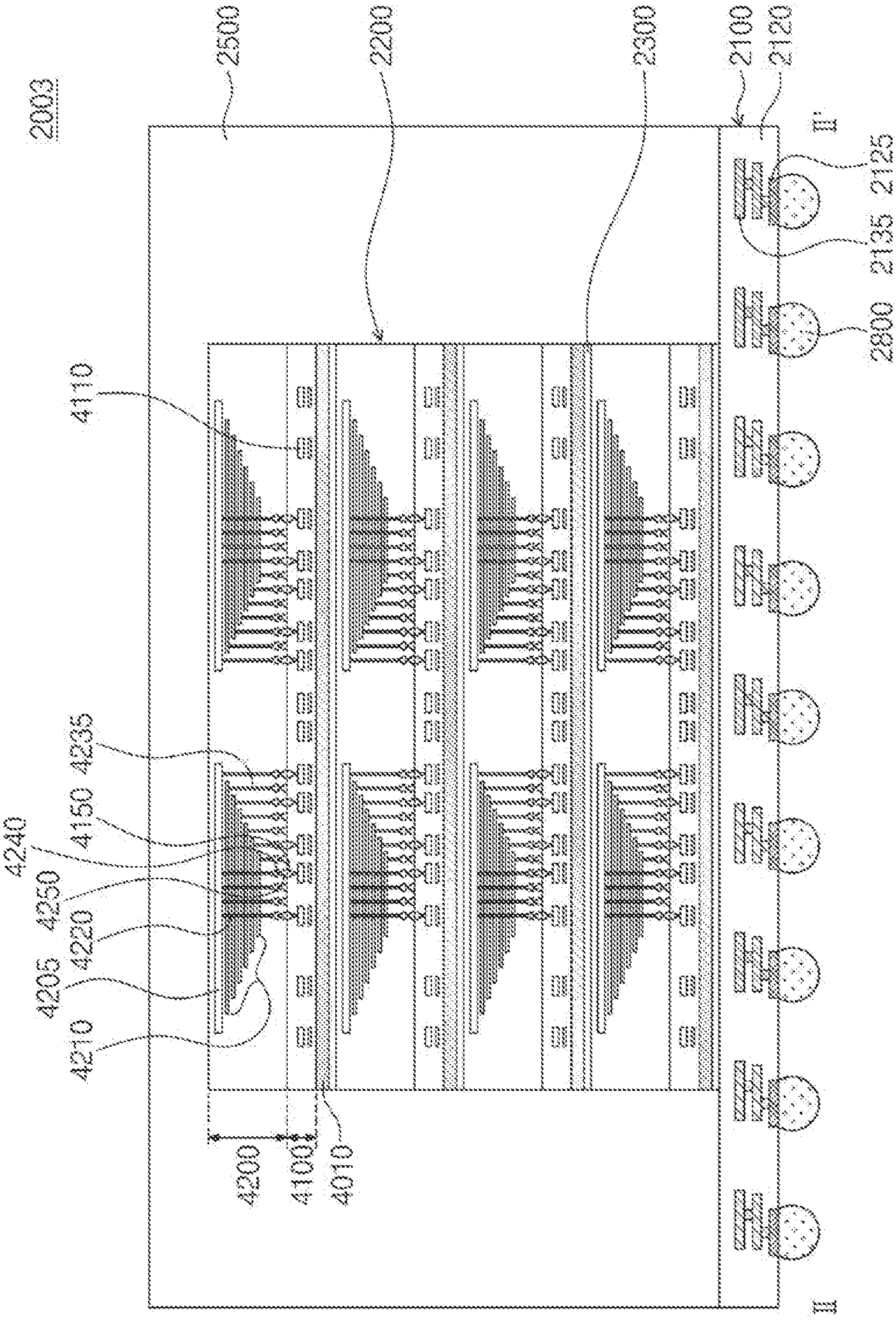

FIGS. 3 and 4 are sectional views, which are respectively taken along lines I-I' and II-II' of FIG. 2, illustrating a semiconductor package including a three-dimensional semiconductor memory device according to an example embodiment.

Referring to FIGS. 3 and 4, the semiconductor package 2003 may include the package substrate 2100, the semiconductor chips 2200 on the package substrate 2100, and the molding layer 2500 covering the package substrate 2100 and the semiconductor chips 2200.

The package substrate 2100 may include a package substrate body portion 2120, upper pads 2130, which are provided on a top surface of the package substrate body portion 2120 and are exposed to the outside of the package substrate body portion 2120 near the top surface, lower pads 2125, which are provided on a bottom surface of the package substrate body portion 2120 or are exposed to the outside of the package substrate body portion 2120 near the bottom surface, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000, which is shown in FIG. 2, through conductive connecting portions 2800.

Referring to FIGS. 2 and 3, the semiconductor chips 2200 may be provided to have side surfaces, which are not aligned to each other, and other side surfaces, which are aligned to each other. The semiconductor chips 2200 may be electrically connected to each other through the connection structures 2400, which are provided in the form of bonding wires. Each of the semiconductor chips 2200 may include substantially the same elements.

Each of the semiconductor chips 2200 may include a semiconductor substrate 4010, a first structure 4100 on the semiconductor substrate 4010, and a second structure 4200 on the first structure 4100. The second structure 4200 may be connected to the first structure 4100 in a wafer bonding manner.

The first structure 4100 may include peripheral circuit interconnection lines 4110 and first bonding pads 4150. The second structure 4200 may include a common source line 4205, a gate stack 4210, which is provided between the common source line 4205 and the first structure 4100, memory channel structures 4220 and separation structures 4230, which are provided to penetrate the gate stack 4210, and second bonding pads 4250, which are electrically and respectively connected to the memory channel structures 4220 and the word lines WL (e.g., see FIG. 1) of the gate stack 4210. For example, the second bonding pads 4250 may be electrically and respectively connected to the memory channel structures 4220 and the word lines WL through bit lines 4240, which are electrically connected to the memory channel structures 4220, and gate interconnection lines 4235, which are electrically connected to the word lines WL. The first bonding pads 4150 of the first structure 4100 and the second bonding pads 4250 of the second structure 4200 may be in contact with each other and may be coupled to each other. The coupling portions between the first bonding pads 4150 and the second bonding pads 4250 may be formed of or include, for example, copper (Cu).

Each of the semiconductor chips 2200 may further include the input/output pad 2210 and an input/output interconnection line 4265 below the input/output pad 2210. The input/output interconnection line 4265 may be electrically connected to some of the second bonding pads 4250 and some of the peripheral circuit interconnection lines 4110.

Figure 5:
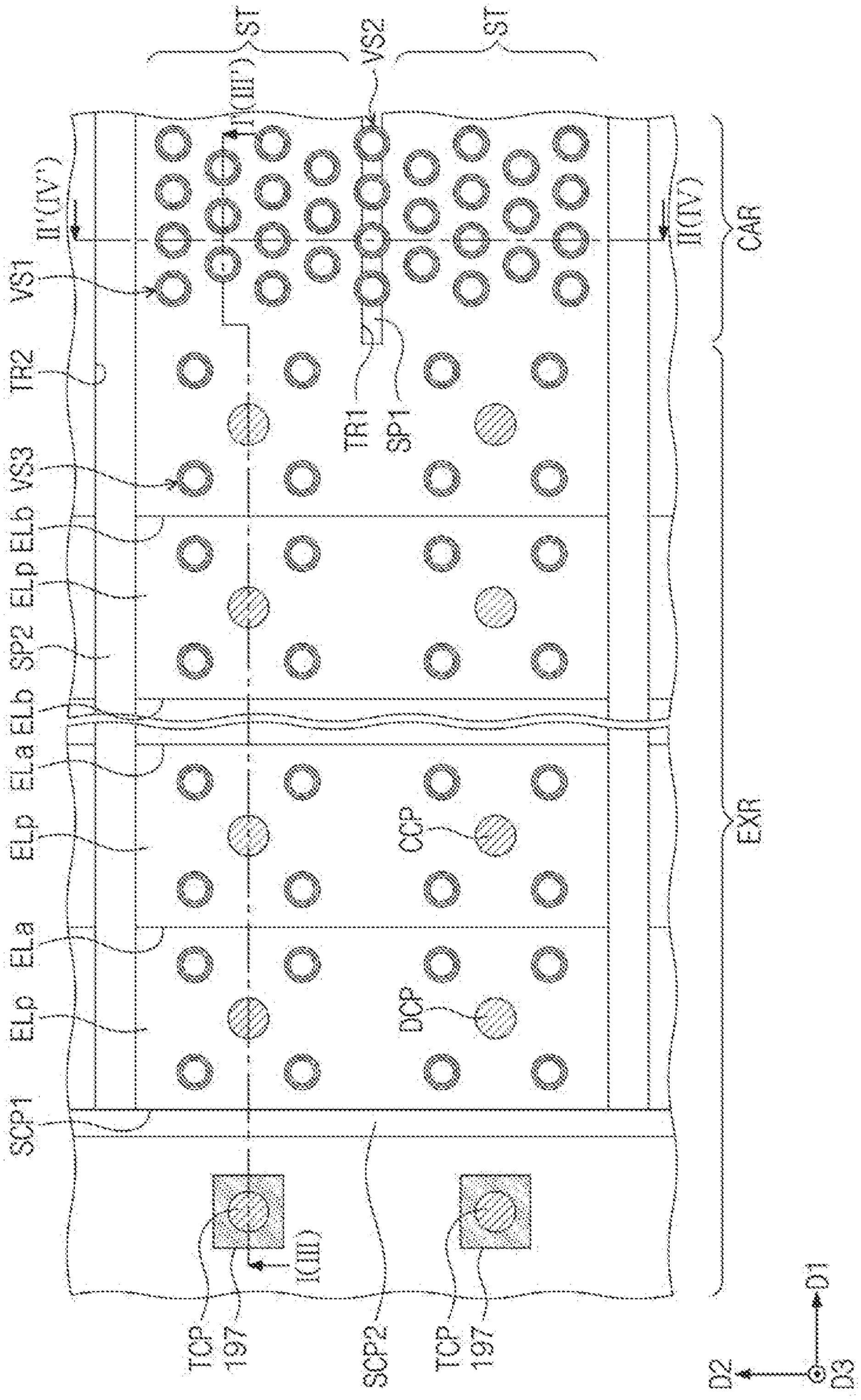
FIG. 5 is a plan view illustrating a three-dimensional semiconductor memory device according to an example embodiment.
Figure 6A:
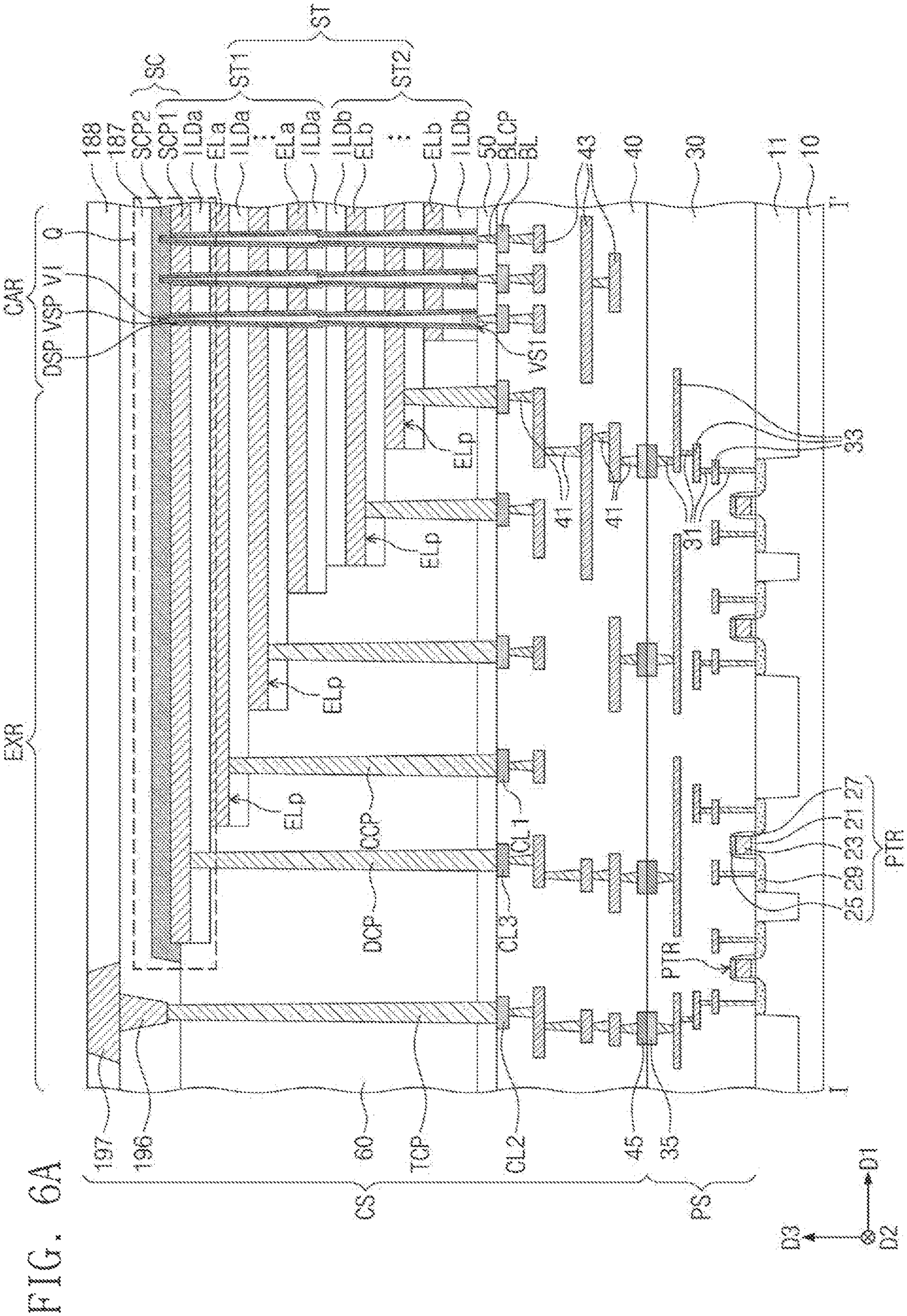
FIGS. 6A and 6B are sectional views, which are respectively taken along lines I-I' and II-II' of FIG. 5, illustrating a three-dimensional semiconductor memory device according to an example embodiment.
Figure 6B:
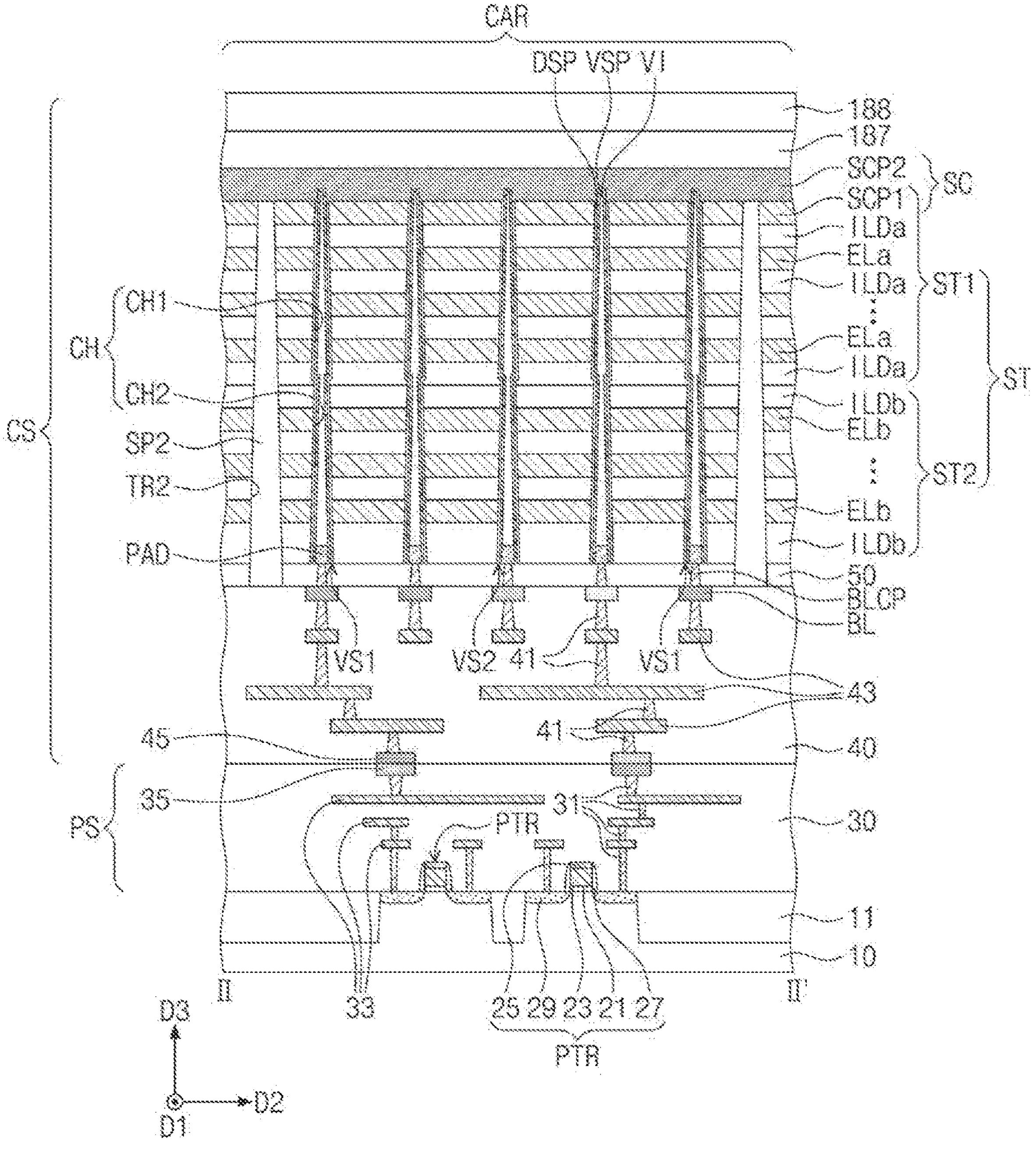
Figure 7A:
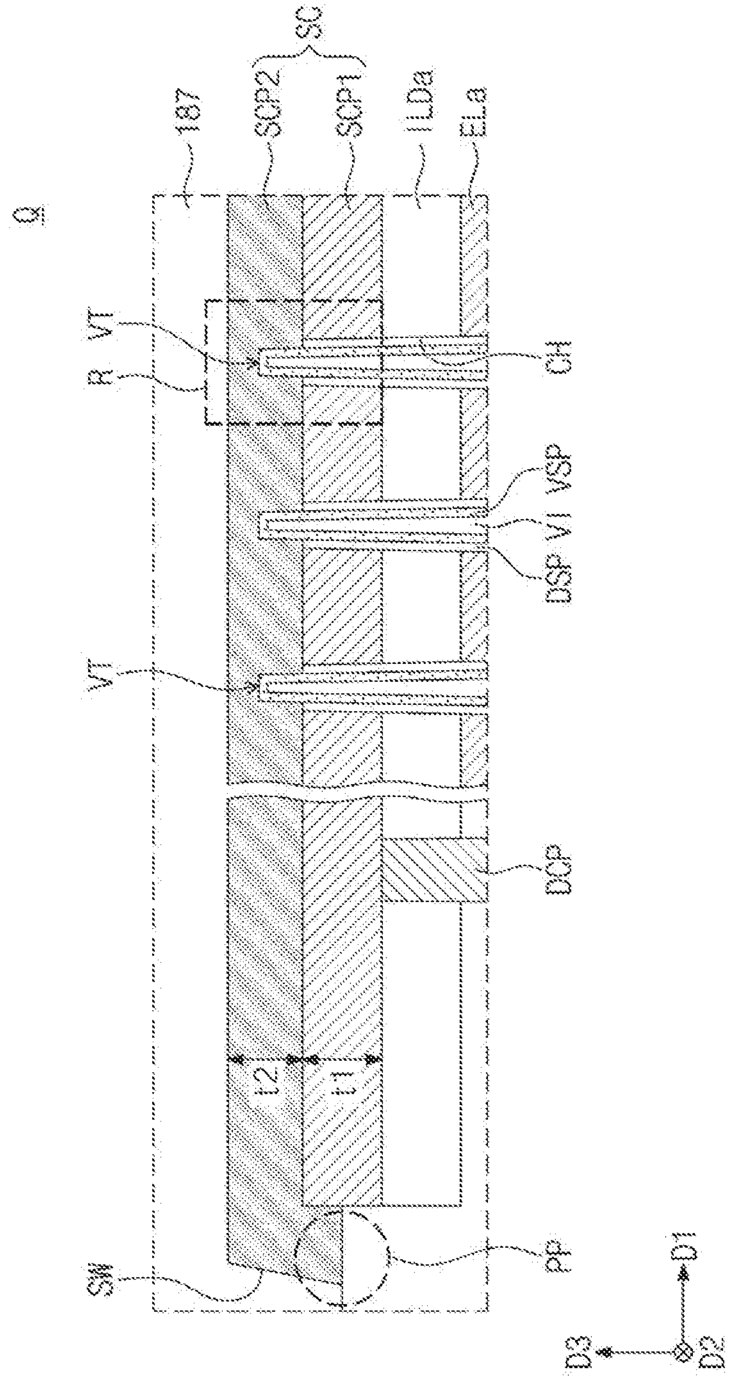
FIG. 7A is an enlarged sectional view illustrating a portion 'Q' of FIG. 6A, according to an example embodiment.
Figure 7B:
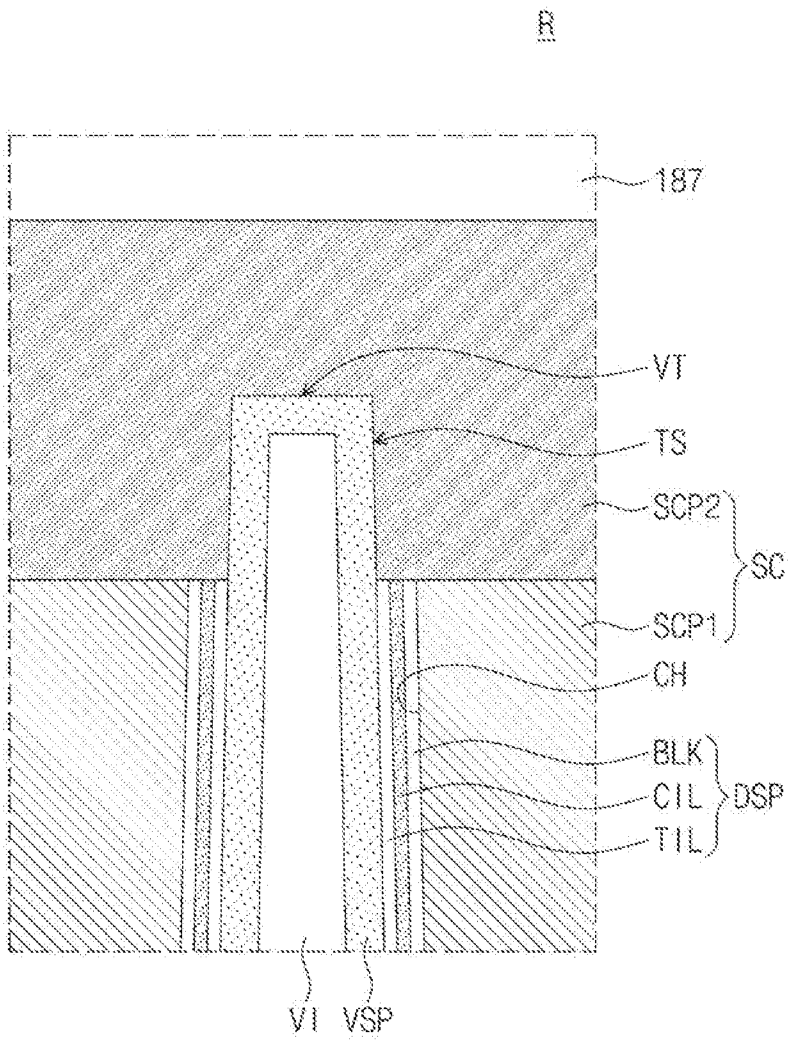
FIG. 7B is an enlarged sectional view illustrating a portion 'R' of FIG. 7A according to an example embodiment.

FIG. 5 is a plan view illustrating a three-dimensional semiconductor memory device according to an example embodiment. FIGS. 6A and 6B are sectional views, which are respectively taken along lines I-I' and II-II' of FIG. 5, illustrating a three-dimensional semiconductor memory device according to an example embodiment. FIG. 7A is an enlarged sectional view illustrating a portion 'Q' of FIG. 6A, according to an example embodiment. FIG. 7B is an enlarged sectional view illustrating a portion 'R' of FIG. 7A according to an example embodiment.

Referring to FIGS. 5, 6A, and 6B, a three-dimensional semiconductor memory device according to an example embodiment may include a substrate 10, a peripheral circuit structure PS on the substrate 10, and a cell array structure CS on the peripheral circuit structure PS. The substrate 10, the peripheral circuit structure PS, and the cell array structure CS may correspond to the semiconductor substrate 4010, the first structure 4100 on the semiconductor substrate 4010, and the second structure 4200 on the first structure 4100, respectively, described with reference to FIGS. 3 and 4.

Since the peripheral circuit structure PS is coupled to the cell array structure CS thereon, the three-dimensional semiconductor memory device may have an increased cell capacity per unit area. In addition, the peripheral circuit structure PS and the cell array structure CS may be separately fabricated and then may be coupled to each other, and in this case, it may be possible to prevent peripheral transistors PTR from being damaged by several thermal treatment processes. Accordingly, the electrical and reliability characteristics of the three-dimensional semiconductor memory device may be improved.

In an embodiment, the substrate 10 may be a silicon substrate, a silicon-germanium substrate, a germanium substrate, or a structure including a single-crystalline silicon substrate and a single-crystalline epitaxial layer grown therefrom. The substrate 10 may have a top surface that is parallel to two different directions (e.g., a first direction D1 and a second direction D2) and is perpendicular to a third direction D3. For example, the first to third directions D1, D2, and D3 may be orthogonal to each other. A device isolation layer 11 may be provided in the substrate 10. The device isolation layer 11 may define an active region of the substrate 10.

The peripheral circuit structure PS may be provided on the substrate 10, and in an embodiment, the peripheral circuit structure PS may include the peripheral transistors PTR, peripheral contact plugs 31, peripheral circuit interconnection lines 33 electrically connected to the peripheral transistors PTR through the peripheral contact plugs 31, first bonding pads 35 electrically connected to the peripheral circuit interconnection lines 33, and a first interlayer insulating layer 30 enclosing them. The peripheral transistors PTR may be provided on the active region of the substrate 10. The peripheral circuit interconnection lines 33 may correspond to the peripheral circuit interconnection lines 4110 of FIGS. 3 and 4, and the first bonding pads 35 may correspond to the first bonding pads 4150 of FIGS. 3 and 4.

In an embodiment, widths of the peripheral contact plugs 31 measured in the first or second direction D1 or D2 may increase as a distance in the third direction D3 increases. The peripheral contact plugs 31 and the peripheral circuit interconnection lines 33 may be formed of or include at least one of conductive materials (e.g., metallic materials).

In an embodiment, the peripheral transistors PTR may constitute at least one of the decoder circuit 1110, the page buffer 1120, and the logic circuit 1130 of FIG. 1. More specifically, each of the peripheral transistors PTR may include a peripheral gate insulating layer 21, a peripheral gate electrode 23, a peripheral capping pattern 25, a peripheral gate spacer 27, and peripheral source/drain regions 29. The peripheral gate insulating layer 21 may be provided between the peripheral gate electrode 23 and the substrate 10. The peripheral capping pattern 25 may be provided on the peripheral gate electrode 23. The peripheral gate spacer 27 may be provided to cover side surfaces of the peripheral gate insulating layer 21, the peripheral gate electrode 23, and the peripheral capping pattern 25. The peripheral source/drain regions 29 may be provided in portions of the substrate 10, which are located at both sides of the peripheral gate electrode 23. The peripheral circuit interconnection lines 33 and the first bonding pads 35 may be electrically connected to the peripheral transistors PTR through the peripheral contact plugs 31. Each of the peripheral transistors PTR may be, for example, an n-type metal-oxide semiconductor (NMOS) transistor or a p-type metal-oxide semiconductor (PMOS) transistor.

The first interlayer insulating layer 30 may be provided on the substrate 10. The first interlayer insulating layer 30 may cover the peripheral transistors PTR, the peripheral contact plugs 31, and the peripheral circuit interconnection lines 33, on the substrate 10. The first interlayer insulating layer 30 may be provided to include a plurality of insulating layers or to have a multi-layered structure. In an embodiment, the first interlayer insulating layer 30 may be formed of or include at least one of silicon oxide, silicon nitride, silicon oxynitride, and/or low-k dielectric materials. The first interlayer insulating layer 30 may not cover top surfaces of the first bonding pads 35. The first interlayer insulating layer 30 may have a top surface that is substantially coplanar with the top surfaces of the first bonding pads 35.

The cell array structure CS may be provided on the peripheral circuit structure PS, and in an embodiment, the cell array structure CS may include second bonding pads 45, the bit lines BL, a stack ST, and a second source conductive pattern SCP2. The cell array structure CS may include a cell array region CAR and a cell array contact region EXR. The cell array contact region EXR may be extended from the cell array region CAR in an opposite direction of the first direction D1 (or in the first direction D1).

The second bonding pads 45, the bit lines BL, and the stack ST may correspond to the second bonding pads 4250, the bit lines 4240, and the gate stack 4210, respectively, described with reference to FIGS. 3 and 4. A second interlayer insulating layer 40, connection contact plugs 41, connection circuit interconnection lines 43, and the second bonding pads 45 may be provided on the first interlayer insulating layer 30. Here, the second bonding pads 45 may be provided to be in contact with the first bonding pads 35 of the peripheral circuit structure PS, the connection circuit interconnection lines 43 may be electrically connected to the second bonding pads 45 through the connection contact plugs 41, and the second interlayer insulating layer 40 may be provided to enclose the connection contact plugs 41, the connection circuit interconnection lines 43, and the second bonding pads 45.

The second interlayer insulating layer 40 may have a multi-layered structure including a plurality of insulating layers. In an embodiment, the second interlayer insulating layer 40 may be formed of or include at least one of silicon oxide, silicon nitride, silicon oxynitride, and/or low-k dielectric materials.

In an embodiment, widths of the connection contact plugs 41 measured in the first or second direction D1 or D2 may decrease as a distance in the third direction D3 increases. The connection contact plugs 41 and the connection circuit interconnection lines 43 may be formed of or include at least one of conductive materials (e.g., metallic materials).

The second interlayer insulating layer 40 may not cover bottom surfaces of the second bonding pads 45. A bottom surface of the second interlayer insulating layer 40 may be substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include at least one of metallic materials (e.g., copper (Cu), tungsten (W), aluminum (Al), nickel (Ni), or tin (Sn)). For example, the first and second bonding pads 35 and 45 may be formed of or include copper (Cu). The first and second bonding pads 35 and 45 may be connected to each other without any interface therebetween and may form a single object. The side surfaces of the first and second bonding pads 35 and 45 are illustrated to be aligned to each other, but the disclosure is not limited to this example. For example, the side surfaces of the first and second bonding pads 35 and 45 may be spaced apart from each other, when viewed in a plan view.

The bit lines BL and first to third conductive lines CL1, CL2, and CL3, which are in contact with the connection contact plugs 41, may be provided in an upper portion of the second interlayer insulating layer 40. In an embodiment, the bit lines BL and the first to third conductive lines CL1, CL2, and CL3 may be extended in the second direction D2 and may be spaced apart from each other in the first direction D1. The bit lines BL and the first to third conductive lines CL1, CL2, and CL3 may be formed of or include at least one of conductive materials (e.g., metallic materials).

A third interlayer insulating layer 50 may be provided on the second interlayer insulating layer 40. A fourth interlayer insulating layer 60 and the stack ST may be provided on the third interlayer insulating layer 50, and here, the stack ST may be enclosed by the fourth interlayer insulating layer 60. The third and fourth interlayer insulating layers 50 and 60 may be a multi-layered structure including a plurality of insulating layers. In an embodiment, the third and fourth interlayer insulating layers 50 and 60 may be formed of or include at least one of silicon oxide, silicon nitride, silicon oxynitride, and/or low-k dielectric materials.

Bit line contact plugs BLCP may be provided in the third interlayer insulating layer 50. The bit line contact plugs BLCP may be extended in the third direction D3 to connect the bit lines BL to first vertical channel structures VS1, which will be described below.

Cell contact plugs CCP, a source contact plug DCP, and a penetration contact plug TCP may be provided to penetrate the third interlayer insulating layer 50 and the fourth interlayer insulating layer 60. The cell contact plugs CCP may be extended in the third direction D3 to connect the first conductive lines CL1 to gate electrodes ELa and ELb of the stack ST, which will be described below. Each of the cell contact plugs CCP may be provided to penetrate one of interlayer insulating layers ILDa and ILDb of the stack ST, which will be described below. The penetration contact plug TCP may be extended in the third direction D3 to connect the second conductive line CL2 to a back-side conductive pattern 197, which will be described below. The source contact plug DCP may be extended in the third direction D3 to connect a source structure SC, which will be described below, to the third conductive line CL3.

The bit line contact plugs BLCP, the cell contact plugs CCP, and the penetration contact plug TCP may be spaced apart from each other in the first direction D1. Widths of the bit line contact plugs BLCP, the cell contact plugs CCP, the source contact plug DCP, and the penetration contact plug TCP, which are measured in the first and/or second directions D1 and/or D2, may decrease with increasing distance in the third direction D3. The bit line contact plugs BLCP, the cell contact plugs CCP, the source contact plug DCP, and the penetration contact plug TCP may be formed of or include at least one of metallic materials (e.g., tungsten).

The stack ST may be provided on the third interlayer insulating layer 50. The stack ST may be enclosed by the fourth interlayer insulating layer 60. A bottom surface of the stack ST (i.e., in contact with the third interlayer insulating layer 50) may be substantially coplanar with a bottom surface of the fourth interlayer insulating layer 60.

In an embodiment, a plurality of the stacks ST may be provided. The stacks ST may be extended in the first direction D1 and may be spaced apart from each other in the second direction D2, when viewed in the plan view of FIG. 5. Hereinafter, just one stack ST will be described, for brevity's sake, but the others of the stacks ST may also have substantially the same features as described below.

The stack ST may include interlayer insulating layers and conductive patterns, which are alternately and repeatedly disposed. The stack ST may have an inverted staircase structure which is composed of the interlayer insulating layers and the conductive patterns. As an example, the stack ST may include a first stack ST1 and a second stack ST2. The first stack ST1 may include first interlayer insulating layers ILDa and first gate electrodes Ela, which are alternatively stacked, and the second stack ST2 may include second interlayer insulating layers ILDb and second gate electrodes ELb, which are alternatively stacked.

The second stack ST2 may be provided between the first stack ST1 and the substrate 10. More specifically, the second stack ST2 may be provided on a bottom surface of the bottommost one of the first interlayer insulating layers ILDa of the first stack ST1. The topmost one of the second interlayer insulating layers ILDb of the second stack ST2 may be in contact with the bottommost one of the first interlayer insulating layers ILDa of the first stack ST1, but the disclosure is not limited to this example. For example, a single insulating layer may be provided between the topmost one of the second gate electrodes ELb of the second stack ST2 and the first gate electrodes ELa of the first stack ST1.

The first stack ST1 may include a first source conductive pattern SCP1, which is provided as the uppermost one of the first gate electrodes ELa. In other words, the first source conductive pattern SCP1 may be the uppermost one of conductive patterns in the first stack ST1.

The first and second gate electrodes ELa and ELb and the first source conductive pattern SCP1 may be formed of the same material at the same time. For example, the first and second gate electrodes ELa and ELb and the first source conductive pattern SCP1 may be formed of or include at least one of, for example, doped semiconductor materials (e.g., doped silicon and so forth), metallic materials (e.g., tungsten, molybdenum, nickel, copper, aluminum, and so forth), conductive metal nitrides (e.g., titanium nitride, tantalum nitride, and so forth), or transition metals (e.g., titanium, tantalum, and so forth). The first and second interlayer insulating layers ILDa and ILDb may be formed of or include at least one of silicon oxide, silicon nitride, silicon oxynitride, and/or low-k dielectric materials. For example, the first and second interlayer insulating layers ILDa and ILDb may be formed of or include high density plasma (HDP) oxide or tetraethyl orthosilicate (TEOS).

On the cell array contact region EXR, a thickness of each of the first and second stacks ST1 and ST2 in the third direction D3 may decrease with increasing distance from the outermost one of first vertical channel structures VS1, which will be described below. In other words, each of the first and second stacks ST1 and ST2 may have a staircase structure, which is inverted in the first direction D1.

More specifically, lengths, in the first direction D1, of the first and second gate electrodes ELa and ELb and the first source conductive pattern SCP1 may increase as a distance from the substrate 10 increases. The first and second gate electrodes ELa and ELb and the first source conductive pattern SCP1 may have side surfaces, which are spaced apart from each other by a constant distance in the first direction D1, when viewed in the plan view of FIG. 5. The lowermost one of the second gate electrodes ELb of the second stack ST2 may have the shortest length, and the first source conductive pattern SCP1 may have the longest length, when measured in the first direction D1.

The first and second gate electrodes ELa and ELb and the first source conductive pattern SCP1 may include pad portions ELp, which are disposed on the cell array contact region EXR. The pad portions ELp may be disposed at positions that are different from each other in horizontal and vertical directions. The pad portions ELp may be provided to form a staircase structure in the first direction D1. Each of the cell contact plugs CCP may penetrate a corresponding one of the first and second interlayer insulating layers ILDa and ILDb and may be in contact with the pad portion ELp of a corresponding one of the first and second gate electrodes ELa and ELb. The source contact plug DCP may penetrate the first interlayer insulating layers ILDa and may be in contact with the pad portion ELp of the first source conductive pattern SCP1.

Each of the first and second interlayer insulating layers ILDa and ILDb may be provided between a corresponding pair of the first and second gate electrodes ELa and ELb and may have a side surface that is aligned to a side surface of a corresponding one of the first and second gate electrodes ELa and ELb and the source contact plug DCP disposed thereon. As a distance from the substrate 10 increases, lengths of the first and second interlayer insulating layers ILDa and ILDb in the first direction D1 may increase. The lowermost one of the second interlayer insulating layers ILDb may have a thickness larger than the others in the third direction D3, but the disclosure is not limited to this example.

Vertical channel holes CH may be formed on the cell array region CAR to penetrate the stack ST in the third direction D3, and first and second vertical channel structures VS1 and VS2 may be provided in the vertical channel holes CH. The first vertical channel structures VS1 may correspond to the memory channel structures 4220 of FIGS. 3 and 4.

The vertical channel holes CH may also be formed on the cell array contact region EXR to penetrate at least a portion of the stack ST and the fourth insulating layer 60 in the third direction D3, and third vertical channel structures VS3 may be provided in the vertical channel holes CH, which are formed on the cell array contact region EXR. As shown in FIG. 5, a plurality of third vertical channel structures VS3 may be formed around each of the source and cell contact plugs DCP or CCP.

The vertical channel holes CH may include first vertical channel holes CH1 and second vertical channel holes CH2, which are connected to the first vertical channel holes CH1. Widths of the first and second vertical channel holes CH1 and CH2 measured in the first or second direction D1 or D2 may decrease with increasing distance from the substrate 10. The first and second vertical channel holes CH1 and CH2 may have different diameters from each other near a boundary region, where the first and second vertical channel holes CH1 and CH2 are connected to each other. In detail, an upper diameter of each of the second vertical channel holes CH2 may be smaller than a lower diameter of each of the first vertical channel holes CH1. The first and second vertical channel holes CH1 and CH2 may form a stepwise structure near the boundary region. However, the disclosure is not limited to this example, and in an embodiment, the first to third vertical channel structures VS1, VS2, and VS3 may be provided in three or more vertical channel holes CH, which are provided to form stepwise structures at two or more different levels, or may be provided in the vertical channel holes CH whose side surfaces are substantially flat without such a stepwise structure.

As shown in FIGS. 6B, 7A, and 7B, each of the first to third vertical channel structures VS1, VS2, and VS3 may include a conductive pad PAD, which is adjacent to the third interlayer insulating layer 50, a data storage pattern DSP, which is provided to conformally cover an inner side surface of each of the first and second vertical channel holes CH1 and CH2, a vertical semiconductor pattern VSP, which is provided to conformally cover a side surface of the data storage pattern DSP, and a gap-fill insulating pattern VI, which is provided to fill an internal space of each of the first and second vertical channel holes CH1 and CH2 enclosed by the vertical semiconductor pattern VSP and the conductive pad PAD. The vertical semiconductor pattern VSP may be enclosed by the data storage pattern DSP. In an embodiment, each of the first to third vertical channel structures VS1, VS2, and VS3 may have a circular, elliptical, or bar-shaped bottom surface.

The vertical semiconductor pattern VSP may be provided between the data storage pattern DSP and the gap-fill insulating pattern VI and between the data storage pattern DSP and the conductive pad PAD. The vertical semiconductor pattern VSP may have a top-closed pipe or macaroni structure. The vertical semiconductor pattern VSP may be formed of or include at least one of doped semiconductor materials or undoped or intrinsic semiconductor materials and may have a poly-crystalline structure. In an embodiment, the conductive pad PAD may be formed of or include at least one of doped semiconductor materials or conductive materials.

When viewed in the plan view of FIG. 5, a first trench TR1 and a second trench TR2 may be provided to extend in the first direction D1 and to cross the stack ST. The first trench TR1 may be provided in the cell array region CAR, and the second trench TR2 may be extended from the cell array region CAR toward the cell array contact region EXR. A width of each of the first and second trenches TR1 and TR2 in the first or second direction D1 or D2 may decrease with increasing distance from the substrate 10.

A first separation pattern SP1 and a second separation pattern SP2 may be provided to fill the first trench TR1 and the second trench TR2, respectively. The first and second separation patterns SP1 and SP2 may correspond to the separation structures 4230 of FIGS. 3 and 4. A length of the second separation pattern SP2 in the first direction D1 may be larger than a length of the first separation pattern SP1 in the first direction D1. Side surfaces of the first and second separation patterns SP1 and SP2 may be in contact with at least a portion of the first and second gate electrodes ELa and ELb and the first and second interlayer insulating layers ILDa and ILDb of the stack ST. In an embodiment, the first and second separation patterns SP1 and SP2 may be formed of or include at least one of oxide materials (e.g., silicon oxide).

A bottom surface of the second separation pattern SP2 may be substantially coplanar with the bottom surface of the third interlayer insulating layer 50 (i.e., the top surface of the second interlayer insulating layer 40) and the top surfaces of the bit lines BL and the first and second conductive lines CL1 and CL2. A top surface of the second separation pattern SP2 may be located at a level that is lower than the top surfaces of the first to third vertical channel structures VS1, VS2, and VS3.

In the case where a plurality of the stacks ST are provided, the first separation pattern SP1 or the second separation pattern SP2 may be provided between the stacks ST that are arranged in the second direction D2. For example, the stacks ST may be spaced apart from each other in the second direction D2 with the first or second separation pattern SP1 or SP2 interposed therebetween.

The second source conductive pattern SCP2 may be provided on the stack ST. The second source conductive pattern SCP2, along with the first source conductive pattern SCP1, may constitute a source structure SC. The source structure SC may correspond to the common source line 4205 of FIGS. 3 and 4.

The second source conductive pattern SCP2 may be in contact with a top surface of the first source conductive pattern SCP1. The second source conductive pattern SCP2 may be in contact with a top surface of the second separation patterns SP2. The second source conductive pattern SCP2 may be electrically connected to the first source conductive pattern SCP1 and may electrically connect a plurality of first source conductive patterns SCP1, which are spaced apart from each other with the second separation patterns SP2 interposed therebetween. The first to third vertical channel structures VS1, VS2, and VS3 may be provided to penetrate the stack ST and may be inserted into a lower portion of the second source conductive pattern SCP2.

The first source conductive pattern SCP1 may be formed of or include a material having resistivity lower than the second source conductive pattern SCP2. For example, the first source conductive pattern SCP1 may be formed of or include at least one of tungsten, molybdenum, nickel, or conductive nitrides thereof, and the second source conductive pattern SCP2 may be formed of or include doped poly silicon. More specifically, the second source conductive pattern SCP2 may be a poly silicon layer doped with n-type dopants. A doping concentration of the second source conductive pattern SCP2 may range from $2\times10^{15}$ to $9\times10^{15}$.

A thickness t2 of the second source conductive pattern SCP2 may be smaller than a thickness t1 of the first source conductive pattern SCP1. In an embodiment, the thickness t1 of the first source conductive pattern SCP1 may be about 150 Å to 300 Å, and the thickness t2 of the second source conductive pattern SCP2 may be 50 Å to 150 Å. Alternatively, the thickness t2 of the second source conductive pattern SCP2 may be larger than the thickness t1 of the first source conductive pattern SCP1. A top surface of the source contact plug DCP may be located at a level lower than a bottom surface of the second source conductive pattern SCP2.

As shown in FIG. 7A, the second source conductive pattern SCP2 may include a protruding portion PP, which is extended from the cell array contact region EXR to cover at least a portion of a side surface of the first source conductive pattern SCP1. The protruding portion PP may be provided at an end portion of the second source conductive pattern SCP2. A side surface SW of the second source conductive pattern SCP2 may be spaced apart from the side surface of the first source conductive pattern SCP1. The side surface SW of the second source conductive pattern SCP2 may be inclined at a non-right angle, and this may result from a recess region RS, which will be described with reference to FIG. 12A.

The data storage pattern DSP may have a top-opened structure, and the vertical semiconductor pattern VSP may include a protruding portion, which is extended from a top surface of the data storage pattern DSP into the second source conductive pattern SCP2. For example, a top surface VT of the vertical semiconductor pattern VSP may be higher than the top surface of the data storage pattern DSP, and an upper side surface TS and the top surface VT of the vertical semiconductor pattern VSP may be in contact with the second source conductive pattern SCP2.

An impurity concentration of the second source conductive pattern SCP2 may be higher than that of the data storage pattern DSP. The data storage pattern DSP may be extended into a region between the first source conductive pattern SCP1 and the vertical semiconductor pattern VSP. The first vertical channel structures VS1 may be electrically connected to the first source conductive pattern SCP1 through the second source conductive pattern SCP2.

A fifth interlayer insulating layer 187 and a sixth interlayer insulating layer 188 may be sequentially provided on the second source conductive pattern SCP2. A penetration via 196, which is connected to the penetration contact plug TCP, may be provided in the fifth interlayer insulating layer 187. The back-side conductive pattern 197, which is connected to the penetration via 196, may be provided in the sixth interlayer insulating layer 188.

The data storage pattern DSP may include a blocking insulating layer BLK, a charge storing layer CIL, and a tunneling insulating layer TIL, which are sequentially stacked on a side surface of the vertical channel hole CH. The blocking insulating layer BLK may be adjacent to the stack ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK, the charge storing layer CIL, and the tunneling insulating layer TIL may be extended from a region between the stack ST and the vertical semiconductor pattern VSP in the third direction D3. In an embodiment, the Fowler-Nordheim (FN) tunneling phenomenon, which is caused by a voltage difference between the vertical semiconductor pattern VSP and the first and second gate electrodes ELa and ELb, may be used to store or change data in the data storage pattern DSP. In an embodiment, the blocking insulating layer BLK and the tunneling insulating layer TIL may be formed of or include silicon oxide, and the charge storing layer CIL may be formed of or include silicon nitride or silicon oxynitride.

A boundary between the penetration contact plug TCP and the penetration via 196 may be located in the fifth interlayer insulating layer 187. The penetration via 196 may be provided to have a top surface whose width is larger than that of a bottom surface thereof. The back-side conductive pattern 197 may be provided on the penetration via 196. For the back-side conductive pattern 197, a width of a bottom surface may be smaller than a width of a top surface. The back-side conductive pattern 197 may be electrically connected to the second conductive line CL2 through the penetration via 196 and the penetration contact plug TCP, and moreover, it may be electrically connected to at least one of the peripheral transistors PTR of the peripheral circuit structure PS. The back-side conductive pattern 197 may correspond to one of the input/output pad 1101 of FIG. 1 or the input/output pads 2210 of FIGS. 3 and 4. However, in an embodiment, the back-side conductive pattern 197 may be one of back-side metal lines. The back-side conductive pattern 197 may be formed of or include a material that is different from the penetration via 196 and the penetration contact plug TCP. In an embodiment, the back-side conductive pattern 197 may be formed of or include aluminum, and the penetration via 196 and the penetration contact plug TCP may be formed of or include at least one of tungsten, titanium, or tantalum.

According to an example embodiment, at least one of conductive patterns may be used as a first source conductive pattern. In addition, by providing a second source conductive pattern connected to vertical semiconductor patterns, it may be possible to electrically connect the vertical semiconductor patterns to a source contact plug with ease. Since the source contact plug is formed on a stack, it may be possible to form the source contact plug, when cell contact plugs are formed, and increase an integration density of a semiconductor device.

FIGS. 8A, 11A, 12A, and 13A are sectional views, which are taken along the line I-I' of FIG. 5, illustrating a method of fabricating a three-dimensional semiconductor memory device according to an example embodiment. FIGS. 8B, 11B, 12B and 13B sectional views, which is taken along the line II-II' of FIG. 5, illustrating a method of fabricating a three-dimensional semiconductor memory device according to an example embodiment.

Figure 9A:
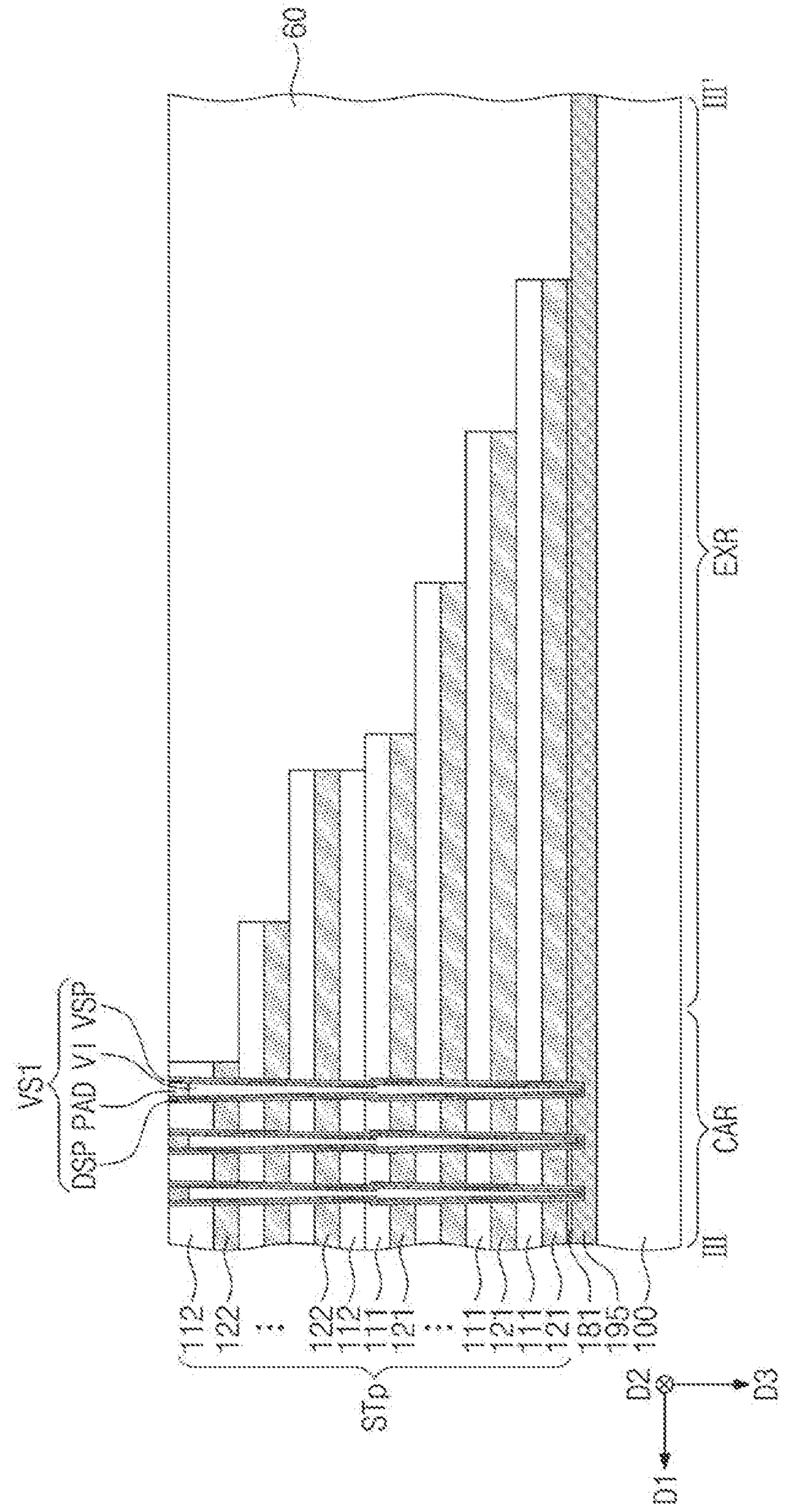
FIGS. 9A and 10A are sectional views, which are taken along a line III-III' of FIG. 5, illustrating a method of fabricating a three-dimensional semiconductor memory device according to an example embodiment.
Figure 9B:
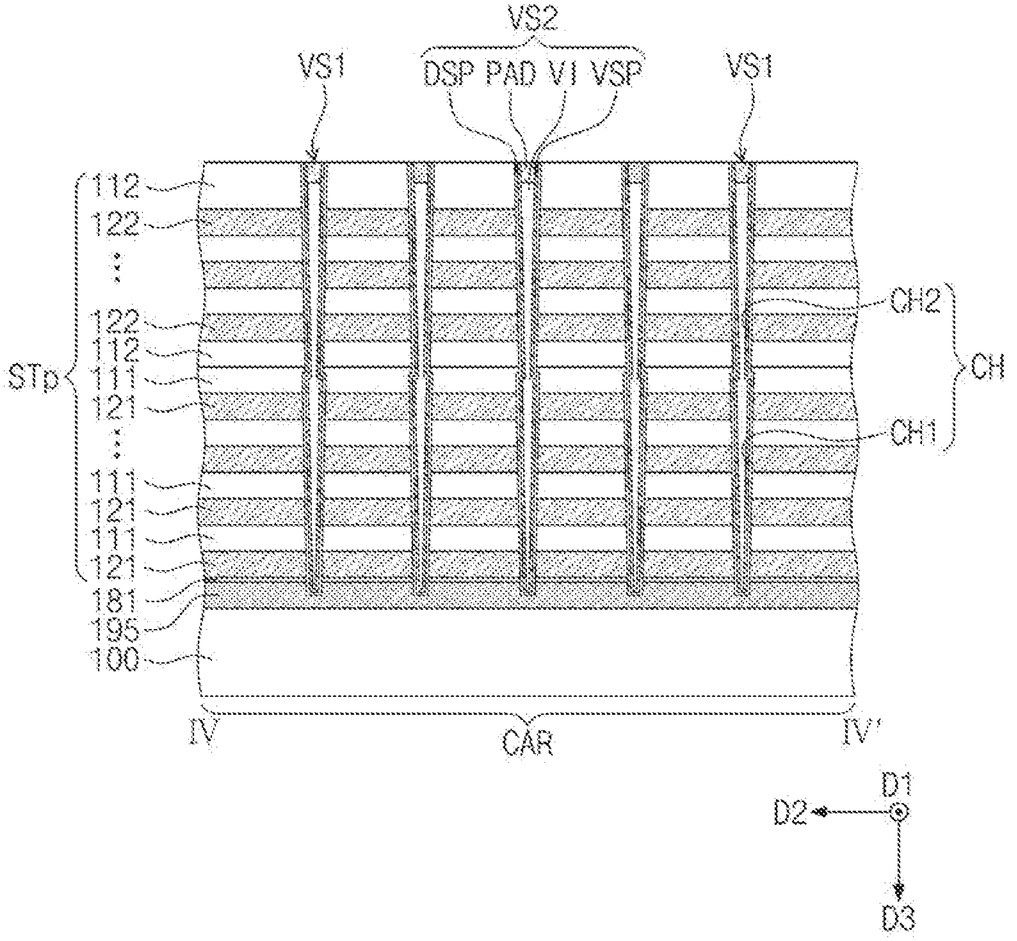
FIGS. 9B and 10B are sectional views, which are taken along a line IV-IV' of FIG. 5, illustrating a method of fabricating a three-dimensional semiconductor memory device according to an example embodiment.
Figure 10A:
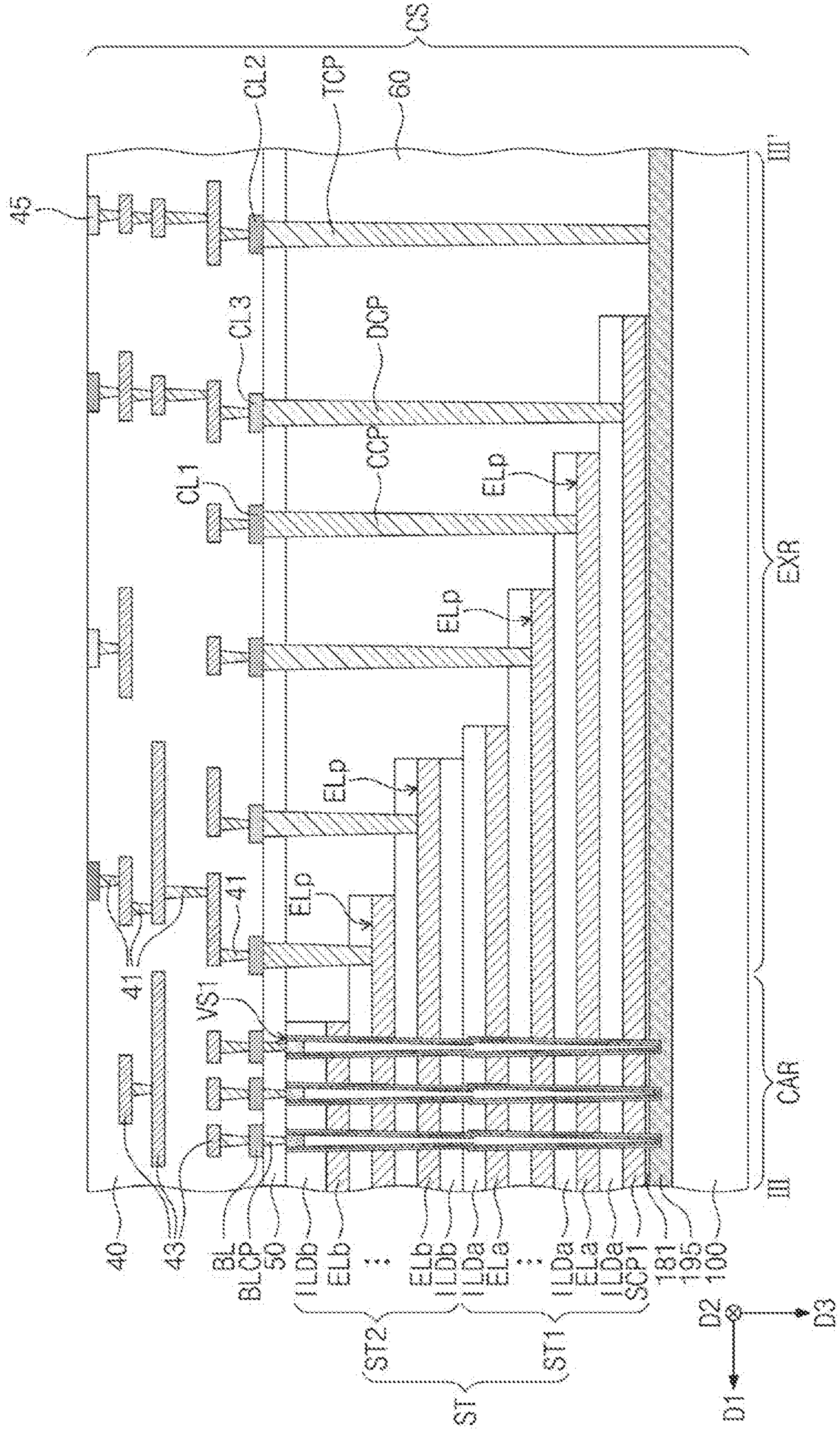
Figure 10B:
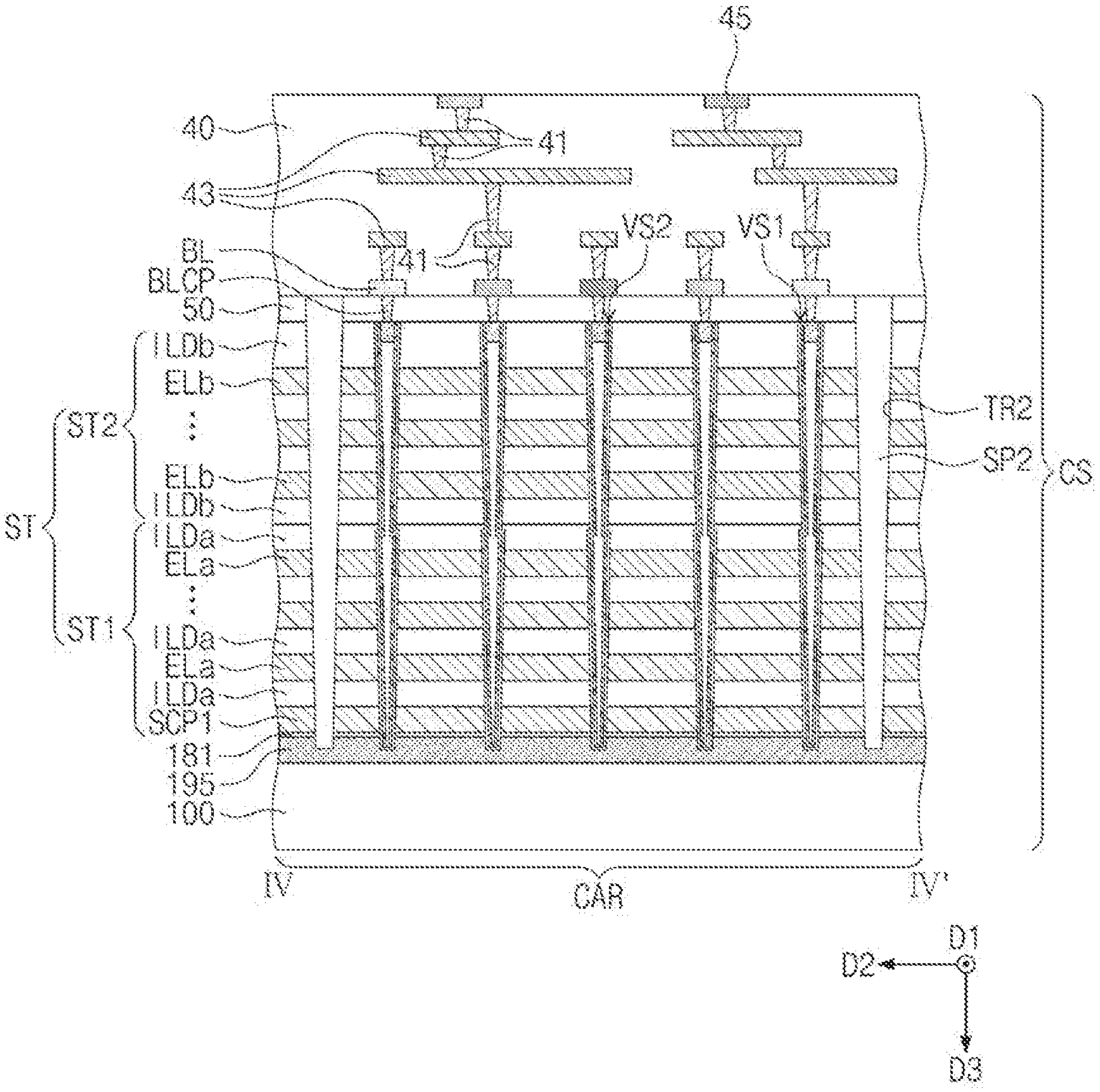

FIGS. 9A and 10A are sectional views, which are taken along a line III-III' of FIG. 5, illustrating a method of fabricating a three-dimensional semiconductor memory device according to an example embodiment. FIGS. 9B and 10B are sectional views, which are taken along a line IV-IV' of FIG. 5, illustrating a method of fabricating a three-dimensional semiconductor memory device according to an example embodiment.

Figure 8A:
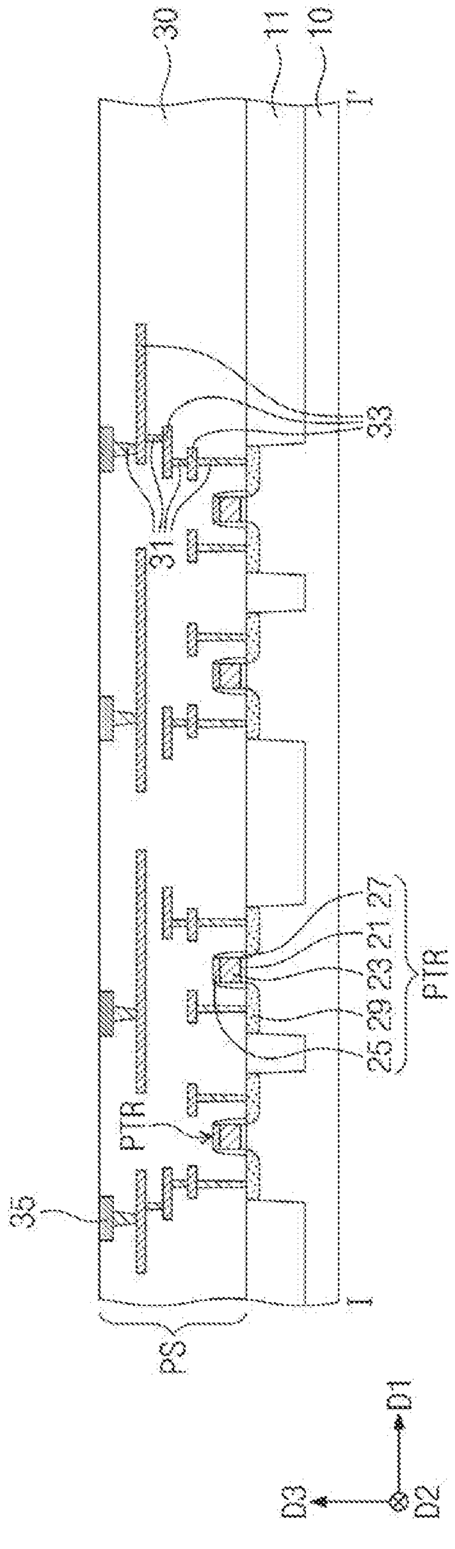
FIG. 8A is a sectional view, which is taken along the line I-I' of FIG. 5, illustrating a method of fabricating a three-dimensional semiconductor memory device according to an example embodiment.
Figure 8B:
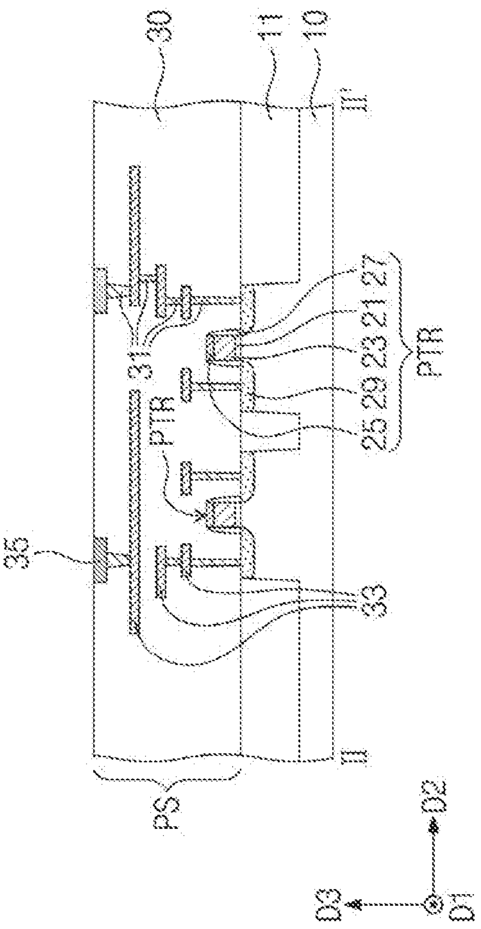
FIG. 8B is a sectional view, which is taken along the line II-II' of FIG. 5, illustrating a method of fabricating a three-dimensional semiconductor memory device according to an example embodiment.

Referring to FIGS. 8A and 8B, the peripheral circuit structure PS may be formed on the substrate 10. The formation of the peripheral circuit structure PS may include forming the device isolation layer 11 in the substrate 10 to define an active region, forming the peripheral transistors PTR on the active region of the substrate 10, and forming the peripheral contact plugs 31, the peripheral circuit interconnection lines 33, the first bonding pads 35, which are electrically connected to the peripheral transistors PTR, and the first interlayer insulating layer 30 covering them.

The first bonding pads 35 may be formed to have top surfaces that are substantially coplanar with a top surface of the first interlayer insulating layer 30. In the following description, the expression of "two elements are coplanar with each other" may mean that a planarization process may be performed on the elements. The planarization process may be performed using, for example, a chemical mechanical polishing (CMP) process or an etch-back process.

Referring to FIGS. 9A and 9B, a lower sacrificial layer 195 and a buffer insulating layer 181 may be formed on a carrier substrate 100. The buffer insulating layer 181 may be formed of or include silicon oxide. The lower sacrificial layer 195 may be formed of or include poly silicon, but in an embodiment, the lower sacrificial layer 195 may be formed of or include at least one of silicon oxide, silicon nitride, or silicon oxynitride.

First interlayer insulating layers 111 and first sacrificial layers 121 may be alternatingly stacked on the lower sacrificial layer 195. Thereafter, the first vertical channel holes CH1 may be formed to penetrate the first interlayer insulating layers 111 and the first sacrificial layers 121, and sacrificial layers may be formed to fill the first vertical channel holes CH1. The first vertical channel holes CH1 may be formed to penetrate the buffer insulating layer 181 and to expose the lower sacrificial layer 195.

Second interlayer insulating layers 112 and second sacrificial layers 122 may be alternatingly stacked on the first vertical channel holes CH1. The first and second sacrificial layers 121 and 122 may be formed of or include an insulating material different from the first and second interlayer insulating layers 111 and 112. The first and second sacrificial layers 121 and 122 may be formed of a material that can be etched with an etch selectivity with respect to the first and second interlayer insulating layers 111 and 112. For example, the first and second sacrificial layers 121 and 122 may be formed of or include silicon nitride, and the first and second interlayer insulating layers 111 and 112 may be formed of or include silicon oxide. Each of the first and second sacrificial layers 121 and 122 may have substantially the same thickness, and thicknesses of the first and second interlayer insulating layers 111 and 112 may vary depending on their vertical position.

Thereafter, the second vertical channel holes CH2 may be formed to penetrate the second interlayer insulating layers 112 and the second sacrificial layers 122 and to expose the sacrificial layers in the first vertical channel holes CH1. The second vertical channel holes CH2 may be overlapped with the first vertical channel holes CH1 in the third direction D3 and may be connected to the first vertical channel holes CH1 to constitute the vertical channel holes CH. The sacrificial layers, which are exposed through the second vertical channel holes CH2, may be removed, and then, the first to third vertical channel structures VS1, VS2, and VS3 may be formed in the vertical channel holes CH. Accordingly, the first and second interlayer insulating layers 111 and 112 and the first and second sacrificial layers 121 and 122, which are alternately stacked, may form a preliminary stack STp. The formation of each of the first to third vertical channel structures VS1, VS2, and VS3 may include forming the data storage pattern DSP and the vertical semiconductor pattern VSP to conformally cover an inner side surface of each of the vertical channel holes CH, forming the gap-fill insulating pattern VI in a space enclosed by the vertical semiconductor pattern VSP, and forming the conductive pad PAD in a space enclosed by the gap-fill insulating pattern VI and the data storage pattern DSP. The first to third vertical channel structures VS1, VS2, and VS3 may have top surfaces that are substantially coplanar with a top surface of the uppermost one of the second interlayer insulating layers 112 and a top surface of the fourth interlayer insulating layer 60.

A trimming process may be performed on the preliminary stack STp, which includes the first and second interlayer insulating layers 111 and 112 and the first and second sacrificial layers 121 and 122 that are alternately stacked. The trimming process may include forming a mask pattern on the cell array region CAR and the cell array contact region EXR to cover a portion of a top surface of the preliminary stack STp, patterning the preliminary stack STp using the mask pattern as a patterning mask, reducing an area of the mask pattern, and patterning the preliminary stack STp using the mask pattern with the reduced area. In an embodiment, the steps of reducing the area of the mask pattern and patterning the preliminary stack STp using the mask pattern may be repeated several times during the trimming process. As a result of the trimming process, each of the first and second interlayer insulating layers 111 and 112 may be at least partially exposed to the outside, and the preliminary stack STp may have a staircase structure on the cell array contact region EXR. The staircase structure of the preliminary stack STp may be formed to expose a portion of the lower sacrificial layer 195. Next, the fourth interlayer insulating layer 60 may be formed to cover the staircase structure of the preliminary stack STp. In an embodiment, the fourth interlayer insulating layer 60 may be formed of or include silicon oxide.

Referring to FIGS. 5, 10A, and 10B, the third interlayer insulating layer 50 may be formed to cover the top surface of the fourth interlayer insulating layer 60. The first and second trenches TR1 and TR2 may be formed to penetrate the third interlayer insulating layer 50, the preliminary stack STp, the buffer insulating layer 181, and at least a portion of the lower sacrificial layer 195. The first and second trenches TR1 and TR2 may be extended from the cell array region CAR to the cell array contact region EXR. A depth of the first trench TR1 may be smaller than a depth of the second trench TR2. A bottom surface of the first trench TR1 may be located at a level that is higher than the top surface of the uppermost one of the first interlayer insulating layers 111. A bottom surface of the second trench TR2 may be located at a level that is lower than the bottom surfaces of the first to third vertical channel structures VS1, VS2, and VS3.

The first and second sacrificial layers 121 and 122, which are exposed through the first and second trenches TR1 and TR2, may be removed. In an embodiment, the removal of the first and second sacrificial layers 121 and 122 may be performed by a wet etching process using hydrofluoric acid (HF) and/or phosphoric acid ($H_3PO_4$) solution.

The first and second gate electrodes ELa and ELb and the first source conductive pattern SCP1 may be formed to fill empty regions that are formed by the removing of the first and second sacrificial layers 121 and 122. The first and second interlayer insulating layers 111 and 112 may be referred to as the first and second interlayer insulating layers ILDa and ILDb of the first and second stacks ST1 and ST2, and as a result, the stack ST including the first and second interlayer insulating layers ILDa and ILDb and the first and second gate electrodes ELa and ELb may be formed. The lowermost one of the first sacrificial layers 121 may be used as the first source conductive pattern SCP1.

The first separation pattern SP1 and the second separation pattern SP2 may be formed to fill the first trench TR1 and the second trench TR2, respectively. The first and second separation patterns SP1 and SP2 may be formed to have top surfaces that are substantially coplanar with a top surface of the third interlayer insulating layer 50.

In the cell array region CAR, the bit line contact plugs BLCP may be formed to penetrate the third interlayer insulating layer 50 and to be in contact with the top surfaces of the first and second vertical channel structures VS1 and VS2. In the cell array contact region EXR, the cell contact plugs CCP may be formed to penetrate the third and fourth interlayer insulating layers 50 and 60 and to be in contact with the pad portions ELp of the first and second gate electrodes ELa and ELb. Each of the cell contact plugs CCP may be formed to penetrate at least a portion of a corresponding one of the first and second interlayer insulating layers ILDa and ILDb. In the cell array contact region EXR, the source contact plug DCP may be formed to penetrate the third and fourth insulating layers 50 and 60 and to be connected to the first source conductive pattern SCP1. In the cell array contact region EXR, the penetration contact plug TCP may be formed to penetrate the third and fourth insulating layers 50 and 60 and to be connected to the lower sacrificial layer 195.

At least two plugs of the cell contact plugs CCP, the source contact plug DCP, and the penetration contact plug TCP may be formed together (e.g., using the same process). The formation of the cell contact plugs CCP, the source contact plug DCP, and the penetration contact plug TCP may include an etching process for forming holes, which are formed to penetrate the third and fourth interlayer insulating layers 50 and 60 and thus have a high aspect ratio.

In the cell array region CAR, the bit lines BL may be formed on the third interlayer insulating layer 50 to be in contact with the bit line contact plugs BLCP. In the cell array contact region EXR, the first to third conductive lines CL1, CL2, and CL3 may be formed on the third interlayer insulating layer 50.

The connection contact plugs 41, the connection circuit interconnection lines 43, and the second bonding pads 45, which are electrically connected to the bit lines BL and the first and second conductive lines CL1 and CL2, and the second interlayer insulating layer 40 covering them may be formed on the third interlayer insulating layer 50. The second bonding pads 45 may be formed to have top surfaces that are substantially coplanar with a top surface of the second interlayer insulating layer 40. Accordingly, the cell array structure CS may be formed on the carrier substrate 100.

Figure 11A:
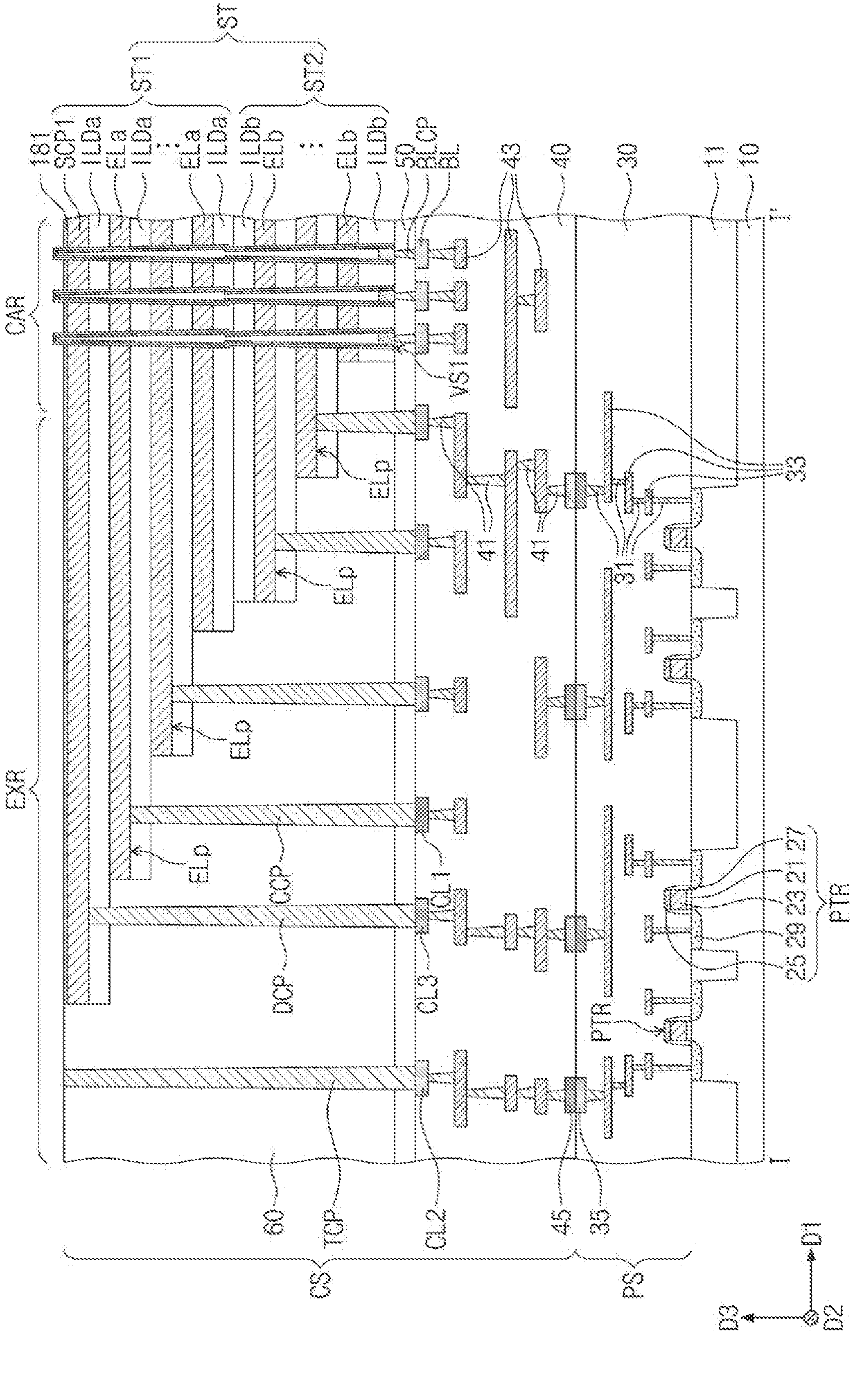
FIGS. 11A, 12A and 13A are sectional views, which are taken along the line I-I' of FIG. 5, illustrating a method of fabricating a three-dimensional semiconductor memory device according to an example embodiment.
Figure 11B:
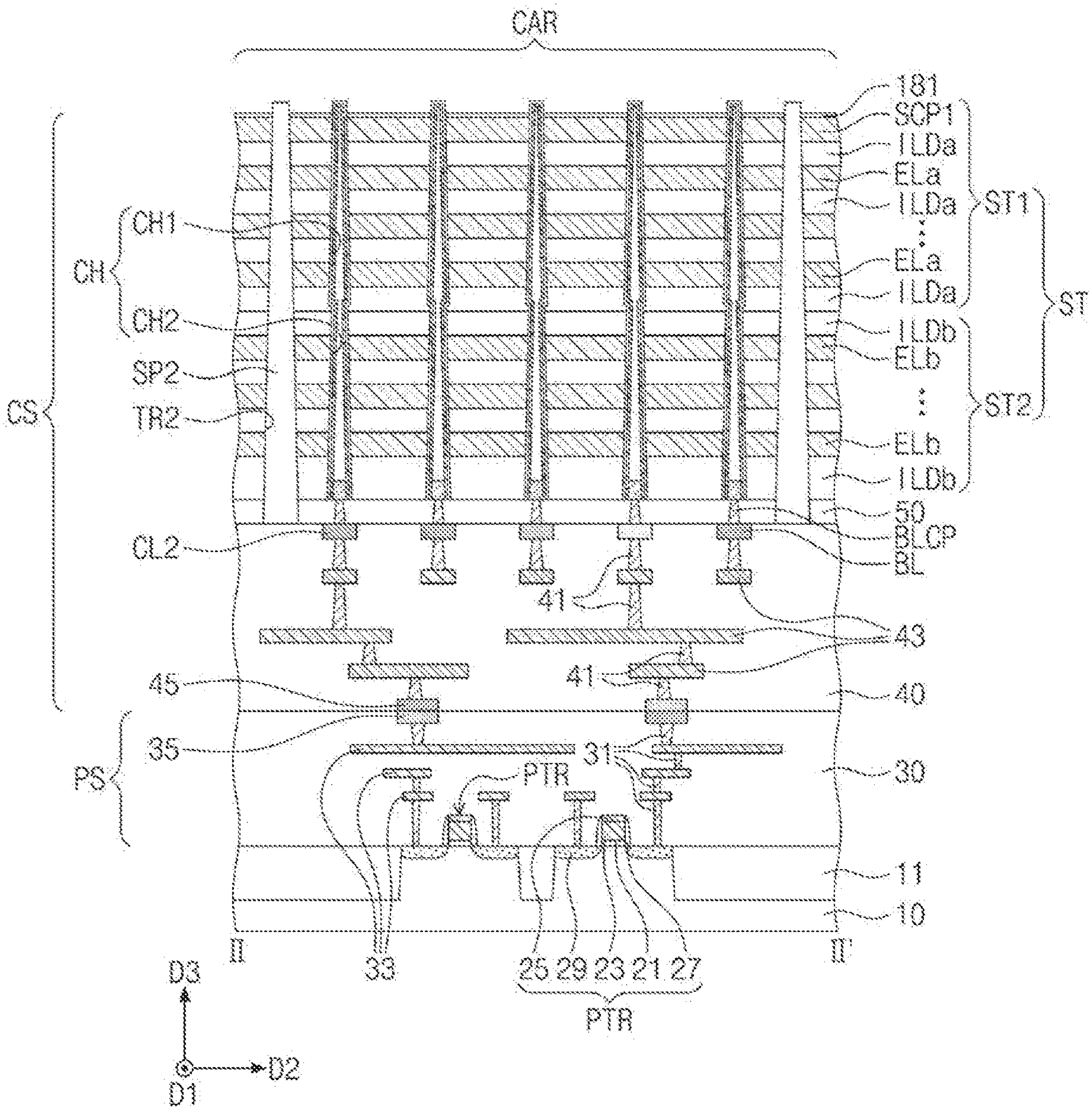
FIGS. 11B, 12B and 13B are sectional views, which are taken along the line II-II' of FIG. 5, illustrating a method of fabricating a three-dimensional semiconductor memory device according to an example embodiment.

Referring to FIGS. 11A and 111B, the cell array structure CS, which is formed on the carrier substrate 100, may be bonded to the peripheral circuit structure PS, which is formed on the substrate 10 by the method described with reference to FIGS. 8A and 8B. In detail, the cell array structure CS may be attached to the peripheral circuit structure PS such that a first surface of the substrate 10, on which the peripheral circuit structure PS is formed, faces a first surface of the carrier substrate 100, on which the cell array structure CS is formed.

The carrier substrate 100 may be provided on the substrate 10 such that the cell array structure CS and the peripheral circuit structure PS face each other. The peripheral circuit structure PS and the cell array structure CS may be bonded to each other by the first bonding pads 35 and the second bonding pads 45, which are in contact with each other and are fused into one. After the bonding of the first and second bonding pads 35 and 45, the carrier substrate 100 may be removed. The lower sacrificial layer 195 and the carrier substrate 100 may be removed together or separately. In an embodiment, the removal of the carrier substrate 100 and the lower sacrificial layer 195 may include a planarization process, a dry etching process, and a wet etching process, which are sequentially performed. As a result of the removal of the carrier substrate 100 and the lower sacrificial layer 195, the buffer insulating layer 181 and the fourth interlayer insulating layer 60 may be exposed. The data storage patterns DSP of the first vertical channel structures VS1 may protrude above the buffer insulating layer 181.

Figure 12A:
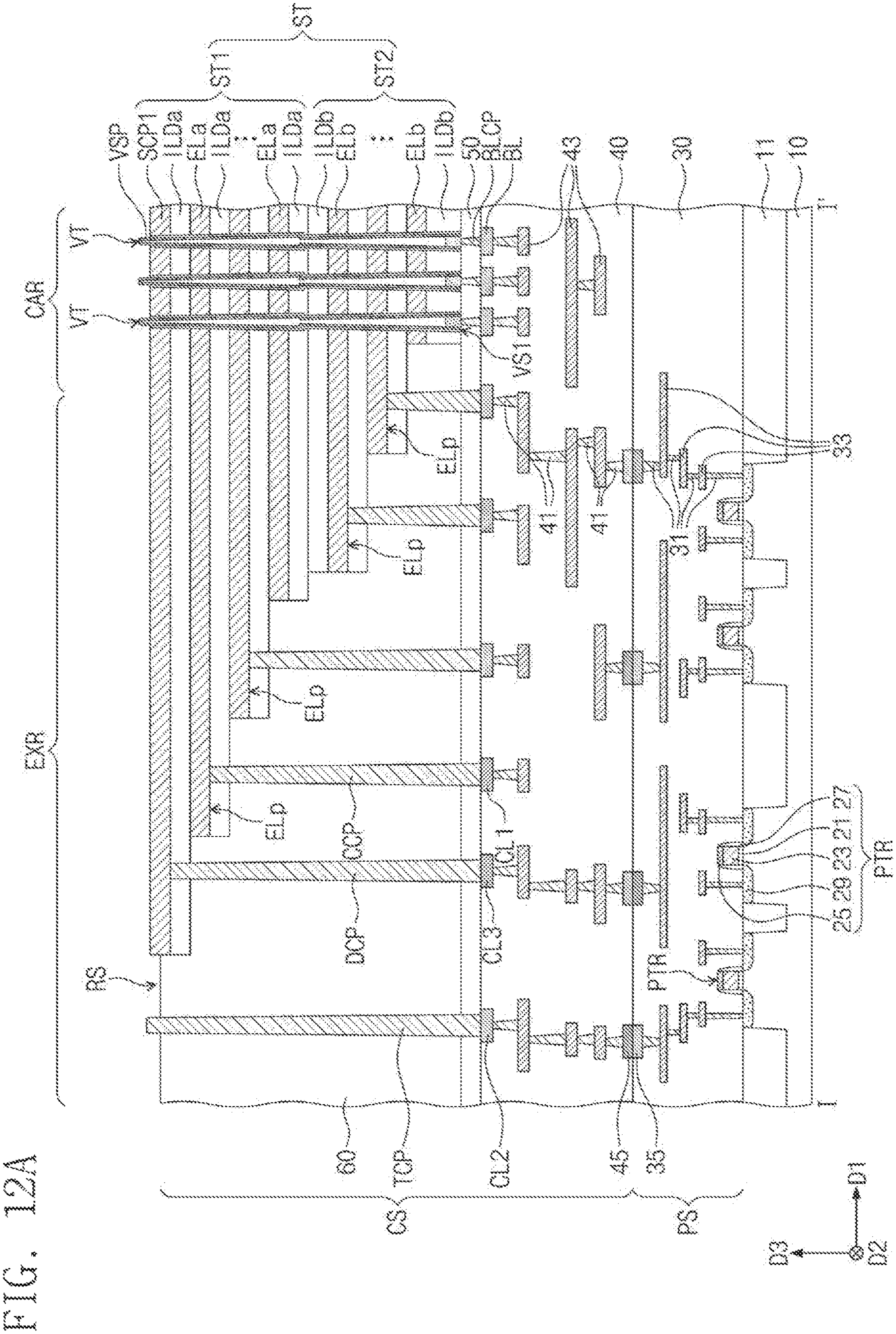
Figure 12B:
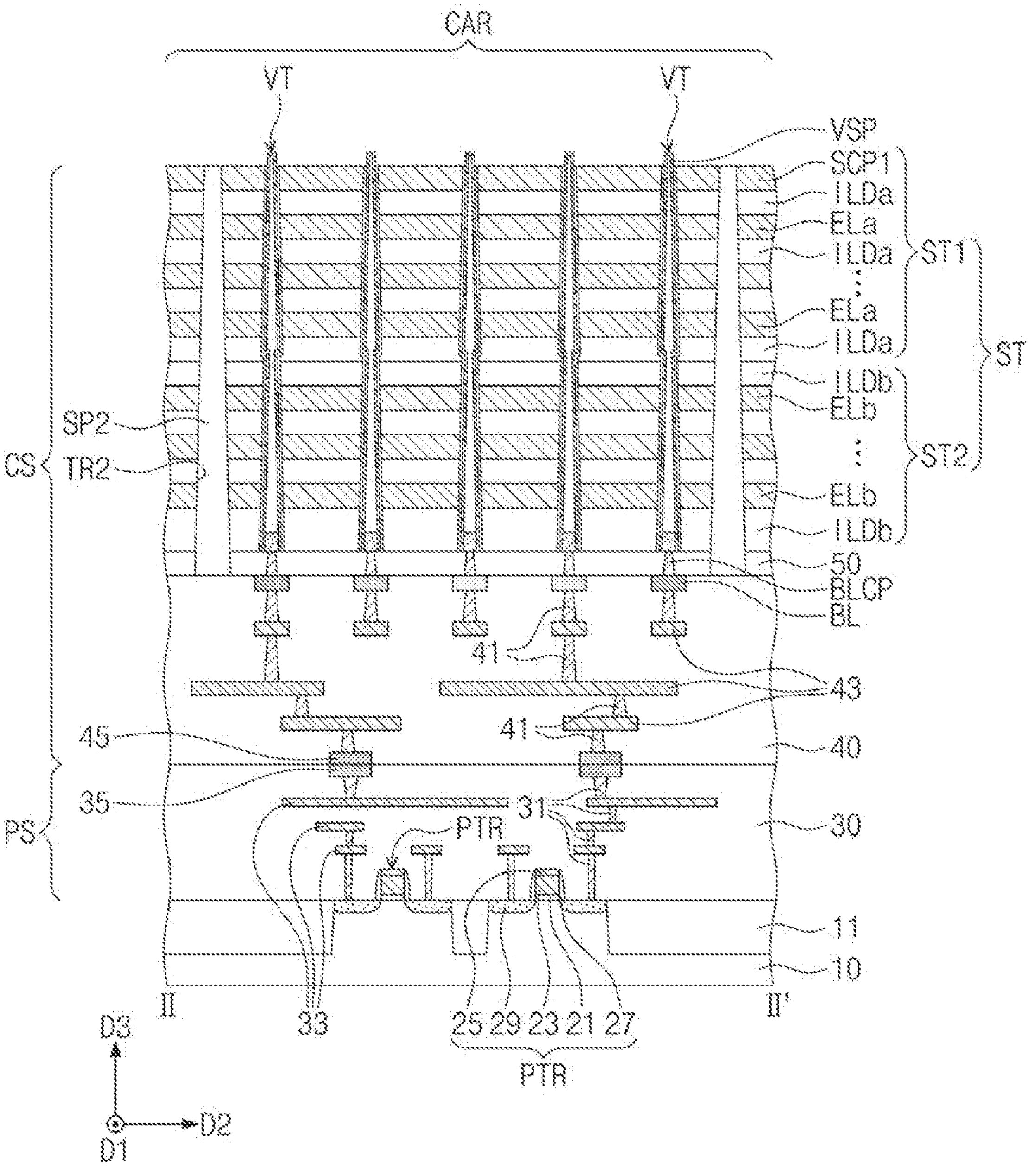

Referring to FIGS. 12A and 12B, top surfaces of the vertical semiconductor patterns VSP may be exposed by removing upper portions of the data storage patterns DSP protruding above the buffer insulating layer 181. During the step of exposing the vertical semiconductor patterns VSP, the buffer insulating layer 181 may also be removed, and the recess region RS may be formed in an upper portion of the fourth interlayer insulating layer 60. A top surface of the fourth interlayer insulating layer 60 defining the recess region RS may be lower than a top surface of the first source conductive pattern SCP1. As a result of the formation of the recess region RS, an upper portion of the penetration contact plug TCP may be exposed to the outside.

Figure 13A:
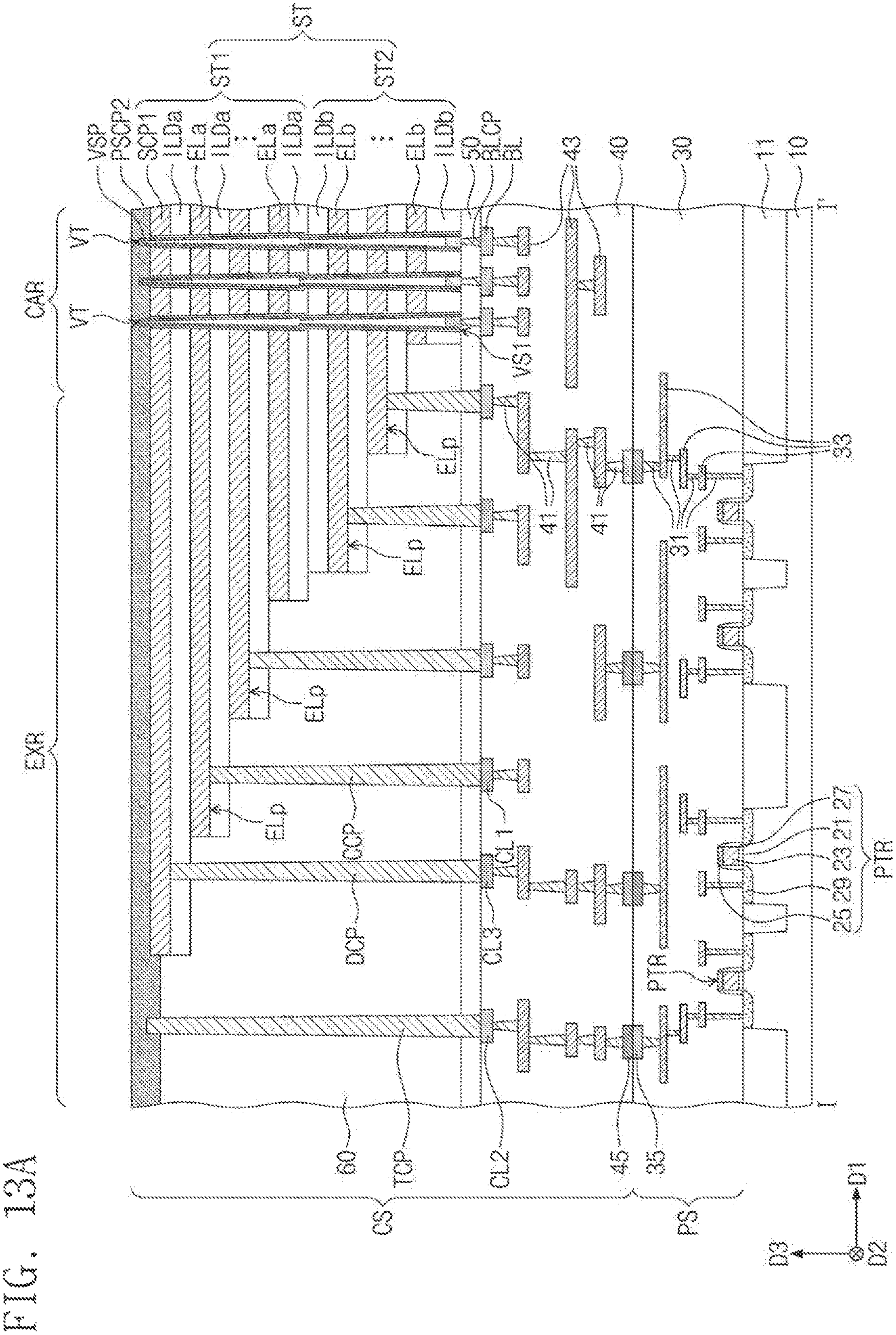
Figure 13B:
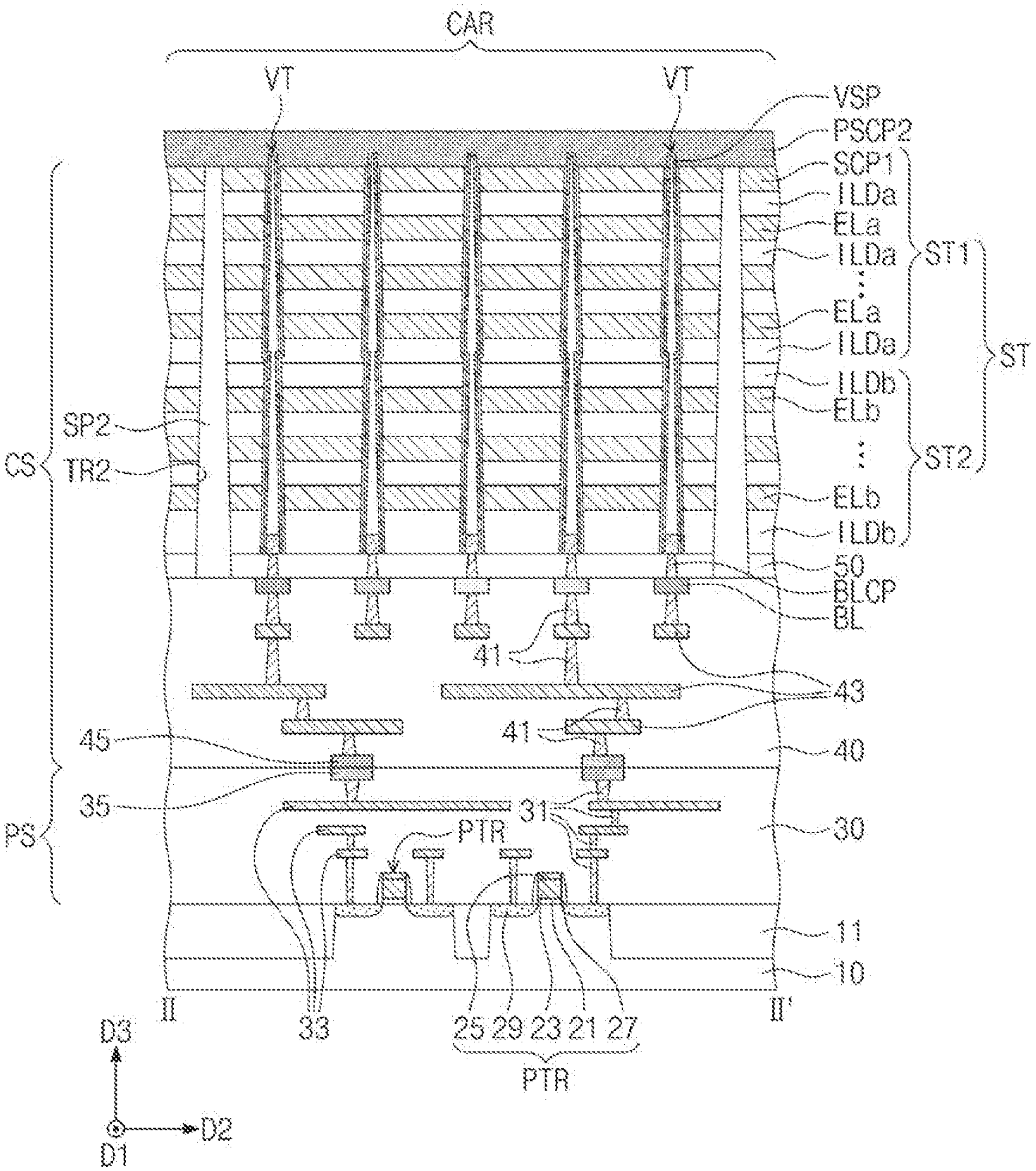

Referring to FIGS. 13A and 13B, a preliminary second source conductive pattern PSCP2 may be formed to cover the first source conductive pattern SCP1. In an embodiment, the preliminary second source conductive pattern PSCP2 may be formed of or include poly silicon that is doped with n-type dopants. The preliminary second source conductive pattern PSCP2 may be in contact with the exposed upper portions of the vertical semiconductor patterns VSP.

Referring back to FIGS. 5, 6A, and 6B, a portion of the preliminary second source conductive pattern PSCP2 may be removed to expose the penetration contact plug TCP. As a result, the second source conductive pattern SCP2 may be formed. The fifth interlayer insulating layer 187 may be formed to cover the second source conductive pattern SCP2 and the penetration contact plug TCP. The fifth interlayer insulating layer 187 may be formed of or include silicon oxide. The penetration via 196 may be formed to penetrate the fifth interlayer insulating layer 187 and may be connected to the penetration contact plug TCP. The penetration via 196 may be formed by forming a penetration hole to penetrate the fifth interlayer insulating layer 187 and filling the penetration hole with a metallic material. As an example, the penetration via 196 may be formed of or include at least one of tungsten, titanium, tantalum, or conductive metal nitrides thereof.

The back-side conductive pattern 197 may be formed on the penetration via 196. The formation of the back-side conductive pattern 197 may include forming a metal layer to cover the penetration via 196, forming a mask pattern to cover the metal layer, and patterning the metal layer using the mask pattern as an etch mask. In this case, a width of a bottom surface of the back-side conductive pattern 197 may be larger than a width of a top surface thereof. In an embodiment, the back-side conductive pattern 197 may be formed of aluminum. Thereafter, the sixth interlayer insulating layer 188 may be formed to cover the fifth interlayer insulating layer 187 and to expose the back-side conductive pattern 197.

According to an example embodiment, at least one of conductive patterns may be used as a first source conductive pattern. In addition, by providing a second source conductive pattern connected to vertical semiconductor patterns, it may be possible to electrically connect the vertical semiconductor patterns to a source contact plug with ease. Since the source contact plug is formed on a stack, it may be possible to form the source contact plug, when cell contact plugs are formed, and increase an integration density of a semiconductor device.

While example embodiments of the disclosure have been particularly shown and described, it will be understood by one of ordinary skill in the art that variations in form and detail may be made therein without departing from the spirit and scope of the attached claims.

What is claimed is:

1. A three-dimensional semiconductor memory device, comprising:

- a substrate;
- a peripheral circuit structure provided on the substrate; and
- a cell array structure provided on the peripheral circuit structure, the cell array structure comprising:
  - a stack comprising alternating interlayer insulating layers and conductive patterns, the conductive patterns comprising gate electrodes and a first source conductive pattern that is an uppermost pattern of the conductive patterns;
  - a second source conductive pattern provided as a single layer and on the stack and in direct contact with a top surface of the first source conductive pattern, the second source conductive pattern comprising a material different from a material of the first source conductive pattern; and
  - vertical channel structures provided to penetrate the stack and to be inserted into a lower portion of the second source conductive pattern,
- wherein the vertical channel structures comprise vertical semiconductor patterns connected to the second source conductive pattern and gap-fill insulating patterns covering inner side surfaces of the vertical semiconductor patterns,
- wherein an upper side surface and the top surface of at least one vertical semiconductor pattern of the vertical semiconductor patterns directly contacts the second source conductive pattern,
- wherein at least one gap-fill insulating pattern among the gap-fill insulating patterns that covers inner side surfaces of the at least one vertical semiconductor pattern extends into the second source conductive pattern, and wherein a top surface of the at least one gap-fill insulating pattern that extends into the second source conductive pattern directly contacts the at least one vertical semiconductor pattern that directly contacts the second source conductive pattern.

2. The three-dimensional semiconductor memory device of claim 1, wherein the material of the first source conductive pattern has a resistivity lower than a resistivity of the material of second source conductive pattern.

3. The three-dimensional semiconductor memory device of claim 2, wherein the material of the first source conductive pattern comprises the same material as a material of the gate electrodes.

4. The three-dimensional semiconductor memory device of claim 2, wherein the material of the second source conductive pattern comprises a doped poly silicon.

5. The three-dimensional semiconductor memory device of claim 3, wherein the material of the first source conductive pattern and the material of the gate electrodes comprise at least one of tungsten, molybdenum, nickel, and conductive nitrides.

6. The three-dimensional semiconductor memory device of claim 1, wherein the second source conductive pattern is thinner than the first source conductive pattern.

7. The three-dimensional semiconductor memory device of claim 1, wherein the cell array structure comprises:

a cell array region, in which the vertical channel structures are provided, and a cell array contact region provided at an end portion of the cell array region, and wherein the second source conductive pattern comprises a protruding portion extending from the cell array contact region to cover at least a portion of a side surface of the first source conductive pattern.

8. The three-dimensional semiconductor memory device of claim 7, wherein the cell array structure further comprises a source contact plug provided in the cell array contact region and connected to the first source conductive pattern, and wherein a top surface of the source contact plug is located at a level lower than a bottom surface of the second source conductive pattern.

9. The three-dimensional semiconductor memory device of claim 1, wherein the vertical channel structures further comprise:

data storage patterns covering outer side surfaces of the vertical semiconductor patterns, and wherein top surfaces of the vertical semiconductor patterns are located at a level higher than top surfaces of the data storage patterns.

10. The three-dimensional semiconductor memory device of claim 9, wherein the data storage patterns extend into regions between the vertical semiconductor patterns and the first source conductive pattern.

11. The three-dimensional semiconductor memory device of claim 9, wherein the top surfaces of the data storage patterns are located at the same level as the top surface of the first source conductive pattern.

12. The three-dimensional semiconductor memory device of claim 1, wherein the stack comprises a first stack and a second stack, wherein the cell array structure comprises a separation pattern between the first stack and the second stack, and wherein a top surface of the separation pattern is located at a level lower than a top surface of the vertical channel structures.

13. The three-dimensional semiconductor memory device of claim 12, wherein a first source conductive pattern of the first stack and a first source conductive pattern of the second stack are horizontally spaced apart, wherein the separation pattern is provided between the first source conductive pattern of the first stack and the first source conductive pattern of the second stack, and wherein the second source conductive pattern electrically connects the first source conductive pattern of the first stack to the first source conductive pattern of the second stack.

* * * * *